(12) United States Patent
Fong et al.

(10) Patent No.: US 9,704,835 B2
(45) Date of Patent: Jul. 11, 2017

(54) THREE DIMENSIONAL INTEGRATED CIRCUIT

(71) Applicant: Silicon Genesis Corporation, San Jose, CA (US)

(72) Inventors: Theodore E. Fong, Pleasanton, CA (US); Michael I. Current, San Jose, CA (US)

(73) Assignee: SILICON GENESIS CORPORATION, Santa Clara, CA (US)

( * ) Notice: Subject to any disclaimer, the term of this patent is extended or adjusted under 35 U.S.C. 154(b) by 0 days.

(21) Appl. No.: 14/993,015

(22) Filed: Jan. 11, 2016

(65) Prior Publication Data
US 2016/0204088 A1    Jul. 14, 2016

Related U.S. Application Data

(60) Provisional application No. 62/101,954, filed on Jan. 9, 2015, provisional application No. 62/120,265, filed on Feb. 24, 2015.

(51) Int. Cl.
| | |
|---|---|
| *H01L 21/822* | (2006.01) |
| *H01L 25/10* | (2006.01) |
| *H01L 21/762* | (2006.01) |
| *H01L 25/00* | (2006.01) |
| H01L 27/06 | (2006.01) |

(52) U.S. Cl.
CPC ...... *H01L 25/105* (2013.01); *H01L 21/76254* (2013.01); *H01L 21/8221* (2013.01); *H01L 25/50* (2013.01); H01L 27/0688 (2013.01); H01L 2225/1094 (2013.01); H01L 2924/0002 (2013.01)

(58) Field of Classification Search
CPC .......... H01L 21/76254; H01L 27/1266; H01L 21/6835; H01L 2924/14; H01L 29/401; H01L 33/0079; H01L 21/8221; H01L 2221/68368; H01L 27/0688
See application file for complete search history.

(56) References Cited

U.S. PATENT DOCUMENTS

| | | | |
|---|---|---|---|
| 6,528,391 B1 | 3/2003 | Henley et al. | |
| 6,780,759 B2 | 8/2004 | Farrens et al. | |
| 6,881,644 B2 | 4/2005 | Malik et al. | |
| 6,908,832 B2 | 6/2005 | Farrens et al. | |

(Continued)

OTHER PUBLICATIONS

"2014 SOI-3D-Subthreshold Microelectronics Technology Unified Conference (S3S)", IEEE S3S-2014 proceedings, Oct. 6-9, 2014, pp. 1, IEEE, Milbrae, CA, USA.

(Continued)

*Primary Examiner* — Bac Au

(57) ABSTRACT

A method comprises providing a first substrate having dielectric structures and conductive structures. Ions are implanted into the first substrate, the ions traveling through the dielectric structures and the conductive structures to define a cleave plane in the first substrate. The first substrate is cleaved at the cleave plane to obtain a cleaved layer having the dielectric structure and the conductive structures. The cleaved layer is used to form a three-dimensional integrated circuit device having a plurality of stacked integrated circuit (IC) layers, the cleaved layer being one of the stacked IC layers.

22 Claims, 25 Drawing Sheets

(56) References Cited

U.S. PATENT DOCUMENTS

| | | | |
|---|---|---|---|
| 7,078,317 B2 | 7/2006 | Henley | |
| 7,094,666 B2 | 8/2006 | Henley et al. | |
| 7,160,790 B2 | 1/2007 | Henley et al. | |
| 7,166,520 B1 | 1/2007 | Henley | |
| 7,244,990 B2* | 7/2007 | Takafuji | H01L 21/6835 257/347 |
| 7,253,040 B2* | 8/2007 | Itoga | H01L 21/2026 257/E21.134 |
| 7,348,258 B2 | 3/2008 | Henley et al. | |
| 7,351,644 B2 | 4/2008 | Henley | |
| 7,354,815 B2 | 4/2008 | Henley | |
| 7,371,660 B2 | 5/2008 | Henley et al. | |
| 7,378,330 B2 | 5/2008 | Henley et al. | |
| 7,390,724 B2 | 6/2008 | Henley et al. | |
| 7,391,047 B2 | 6/2008 | Henley et al. | |
| 7,399,680 B2 | 7/2008 | Henley | |
| 7,427,554 B2 | 9/2008 | Henley et al. | |
| 7,462,526 B2 | 12/2008 | Henley | |
| 7,479,441 B2 | 1/2009 | Kirk et al. | |
| 7,528,446 B2* | 5/2009 | Takafuji | H01L 27/1203 257/347 |
| 7,595,499 B2 | 9/2009 | Henley et al. | |
| 7,598,153 B2 | 10/2009 | Henley et al. | |
| 7,629,666 B2 | 12/2009 | Henley | |
| 7,759,220 B2 | 7/2010 | Henley | |
| 7,772,088 B2 | 8/2010 | Henley et al. | |
| 7,910,458 B2 | 3/2011 | Henley | |
| 8,012,851 B2 | 9/2011 | Henley et al. | |
| 8,071,463 B2 | 12/2011 | Henley | |
| 8,124,499 B2 | 2/2012 | Henley et al. | |
| 8,133,800 B2 | 3/2012 | Henley et al. | |
| 8,143,165 B2 | 3/2012 | Henley | |
| 8,153,513 B2 | 4/2012 | Henley | |
| 8,222,119 B2 | 7/2012 | Henley | |
| 8,241,996 B2 | 8/2012 | Henley et al. | |
| 8,293,619 B2 | 10/2012 | Henley | |
| 8,329,557 B2 | 12/2012 | Brailove et al. | |
| 8,330,126 B2 | 12/2012 | Henley et al. | |
| 8,637,382 B2 | 1/2014 | Henley | |
| 9,336,989 B2 | 5/2016 | Henley | |
| 9,362,439 B2 | 6/2016 | Henley | |
| 2002/0173872 A1 | 11/2002 | Malik | |
| 2003/0003684 A1 | 1/2003 | Farrens et al. | |
| 2003/0008477 A1 | 1/2003 | Kang et al. | |
| 2004/0132304 A1 | 7/2004 | Farrens et al. | |
| 2005/0070071 A1 | 3/2005 | Henley et al. | |
| 2005/0118754 A1 | 6/2005 | Henley | |
| 2005/0150597 A1 | 7/2005 | Henley et al. | |
| 2005/0186758 A1 | 8/2005 | Henley et al. | |
| 2005/0227425 A1 | 10/2005 | Henley | |
| 2005/0233545 A1 | 10/2005 | Henley et al. | |
| 2005/0247668 A1 | 11/2005 | Malik et al. | |
| 2006/0024917 A1 | 2/2006 | Henley et al. | |
| 2006/0030167 A1 | 2/2006 | Henley | |
| 2006/0118935 A1* | 6/2006 | Kamiyama | H01L 21/30608 257/684 |
| 2006/0138583 A1 | 6/2006 | Henley | |
| 2006/0141747 A1 | 6/2006 | Henley et al. | |
| 2006/0160329 A1 | 7/2006 | Henley et al. | |
| 2006/0166472 A1 | 7/2006 | Henley et al. | |
| 2006/0205180 A1 | 9/2006 | Henley et al. | |
| 2006/0211219 A1 | 9/2006 | Henley et al. | |
| 2006/0240645 A1 | 10/2006 | Henley | |
| 2007/0029043 A1 | 2/2007 | Henley | |
| 2007/0032044 A1 | 2/2007 | Henley | |
| 2007/0032084 A1 | 2/2007 | Henley | |
| 2007/0037323 A1 | 2/2007 | Henley et al. | |
| 2007/0051299 A1 | 3/2007 | Ong et al. | |
| 2007/0087531 A1 | 4/2007 | Kirk et al. | |
| 2007/0232022 A1 | 10/2007 | Henley et al. | |
| 2008/0038908 A1 | 2/2008 | Henley | |
| 2008/0128641 A1 | 6/2008 | Henley et al. | |
| 2008/0141510 A1 | 6/2008 | Henley et al. | |
| 2008/0160661 A1 | 7/2008 | Henley | |
| 2008/0206962 A1 | 8/2008 | Henley et al. | |
| 2008/0206963 A1 | 8/2008 | Henley et al. | |
| 2009/0001500 A1 | 1/2009 | Henley | |
| 2009/0042369 A1 | 2/2009 | Henley | |
| 2009/0152162 A1 | 6/2009 | Tian et al. | |
| 2009/0258496 A1 | 10/2009 | Henley | |
| 2009/0277314 A1 | 11/2009 | Henley | |
| 2010/0041246 A1* | 2/2010 | Ramappa | H01L 21/76254 438/795 |
| 2010/0044595 A1 | 2/2010 | Henley et al. | |
| 2010/0052105 A1 | 3/2010 | Henley et al. | |
| 2010/0055874 A1 | 3/2010 | Henley | |
| 2010/0129951 A1 | 5/2010 | Henley | |
| 2010/0180945 A1 | 7/2010 | Henley et al. | |
| 2010/0283104 A1* | 11/2010 | Tada | H01L 21/263 257/347 |
| 2010/0317140 A1 | 12/2010 | Brailove et al. | |
| 2012/0077289 A1 | 3/2012 | Henley | |
| 2013/0032582 A1 | 2/2013 | Henley | |
| 2013/0209740 A1 | 8/2013 | Henley | |
| 2014/0097519 A1* | 4/2014 | Cho | H01L 27/10814 257/618 |
| 2014/0106540 A1 | 4/2014 | Henley | |

OTHER PUBLICATIONS

M. Vinet et al., "Monolithic 3D Integration: a powerful alternative to classical 2D Scaling", IEEE S3S-2014 proceedings, Oct. 6-9, 2014, pp. 1-3, IEEE.

Shreepad Panth et al., "Design Challenges and Solutions for Ultra-High-Density Mololithic 3D ICs", IEEE S3S-2014 proceedings, Oct. 6-9, 2014, pp. 1-2, IEEE.

Deepak C. Sekar, "3D Memory with Shared Lithography Steps: The Memory Industry's Plan to Cram More Components onto Integrated Circuits", IEEE S3S-2014 proceedings, Oct. 6-9, 2014, pp. 1-3, IEEE.

E.A. Fitzgerald et al., "Monolithic 3D Integration in a CMOS Process Flow", IEEE S3S-2014 proceedings, Oct. 6-9, 2014, pp. 1-3, IEEE.

Mohammad Sadegh Ebrahimi et al., "Monolithic 3D Integration Advances and Challenges: From Technology to System Levels", IEEE S3S-2014 proceedings, Oct. 6-9, 2014, pp. 1-2, IEEE.

Thomas Uhrmann et al., "Monolithic IC Integration Key Alignment Aspects for High Process Yield", IEEE S3S-2014 proceedings, Oct. 6-9, 2014, pp. 1-2, IEEE.

Isao Sugaya et al., "New Precision Alignment Methodology for CMOS Wafer Bonding", S3S-2014 proceedings, Oct. 6-9, 2014, pp. 1-3, IEEE.

Zvi Or-Bach et al., "Precision Bonders—A Game Changer for Monolithic 3D", IEEE S3S-2014 proceedings, Oct. 6-9, 2014, pp. 1-4, IEEE.

Report on S3S14: 2014 IEEE SOI-3D-Subthreshold Microelectronic Technology Unified Conference, IEEE S3S-2014 proceedings, Oct. 6-9, 2014, pp. 1-11, IEEE.

Kuan-Neng Chen et al., "Materials challenges in three-dimensional integrated circuits", MRS Bulletin, Mar. 2015, pp. 219-222, vol. 40, Materials Research Society.

Mitsumasa Koyanagi et al., "Applications of three-dimensional LSI", MRS Bulletin, Mar. 2015, pp. 242-247, vol. 40, Materials Research Society.

Subramanian S. Iyer, "Three-dimensional integration: An industry perspective", MRS Bulletin, Mar. 2015, pp. 225-232, vol. 40, Materials Research Society.

Tengfei Jiang et al., "Through-silicon via stress characteristics and reliability impact on 3D integrated circuits", MRS Bulletin, Mar. 2015, pp. 248-256, vol. 40, Material Research Society.

S.Q. Gu, Material innovation opportunities for 3D integrated circuits from a wireless application point of view, MRS Bulletin, Mar. 2015, pp. 233-241, vol. 40, Material Research Society.

Chih Chen et al., "Vertical interconnects of microbumps in 3D integration", MRS Bulletin, Mar. 2015, pp. 257-262, vol. 40, Material Research Society.

"2015 SOI-3D-Subthreshold Microelectronics Technology Unified Conference (S3S)", IEEE S3S proceedings, Oct. 5-8, 2015, pp. 1, IEEE, Rohnert Park, CA, USA.

(56) References Cited

OTHER PUBLICATIONS

Dr. Gary L. Patton "New Game-Changing Product Applications Enabled by SOI", IEEE S3S proceedings, Oct. 5-8, 2015, pp. 1, IEEE.
Tsu-Jae King Liu et al., "Sustaining the Silicon Revolution from 3-D Transistors to 3-D Integration", IEEE S3S proceedings, Oct. 5-8, 2015, pp. 1-3, IEEE.
Christophe Maleville, "Engineered substrates for Moore and More than Moore's law Device Scaling: entering the substrate era", IEEE S3S proceedings, Oct. 5-8, 2015, pp. 1-5, IEEE.
S. Sollier et al., "300mm InGaAsOI substrate fabrication using the Smart Cut™ technology", IEEE S3S proceedings, Oct. 5-8, 2015, pp. 1-2, IEEE.
F. Clermidy et al., "Technology scaling: the CoolCube™ paradigm", IEEE S3S proceedings, Oct. 5-8, 2015, pp. 1-4, IEEE.
Yang Du et al., "Emerging 3DVLSI: Opportunities and Challenges", IEEE S3S proceedings, Oct. 5-8, 2015, pp. 1-5, IEEE.
Subhasish Mitra, "From Nanodevices to Nanosystems: The N3xt Information Technology", IEEE S3S proceedings, Oct. 5-8, 2015, pp. 1, IEEE.
Subramanian S. Iyer, "Monolithic Three-Dimensional Integration for Memory Scaling and Neuromorphic Computing", IEEE S3S proceedings, Oct. 5-8, 2015, pp. 1-7, IEEE.
Michael I. Current et al., "Preliminary Steps Towards Implementing Intimate 3D-IC Stacking with Layer Transfer and Atomic Bonding Methods", IEEE S3S proceedings, Oct. 5-8, 2015, pp. 1-3, IEEE.

Eric Pabo, Heterogeneous integration enabled by advanced wafer bonding, IEEE S3S proceedings, Oct. 5-8, 2015, IEEE, http://s3sconference.org/program/highlights-of-our-2015-conference/.
Takao Yonehara, "Epitaxial Layer Transfer Technology and Application", IEEE S3S proceedings, Oct. 5-8, 2015, pp. 1, IEEE.
Zvi Or-Bach et al., "Modified ELTRAN®—A Game Changer for Monolithic 3D", IEEE S3S proceedings, Oct. 5-8, 2015, pp. 1-3, IEEE.
Deepak Kumar et al., "Power, Performance, and Cost Comparison of Monolithic 3D ICs and TSV-based 3D ICs", IEEE S3S proceedings, Oct. 5-8, 2015, pp. 1-2, IEEE.
Eric Beyne, "Next Technologies for Further Adoption of 3D System Integration Technologies", Semi European 3D TSV Summit, 2016, pp. 1-33, imec, semi.
Andy Heinig et al., "Enabling 3D Systems—A Comprehensive Approach from Design to Technology", European 3D Summit, Jan. 16-20, 2016, pp. 1-27, semi, Fraunhofer.
K. Torki, "3D-IC Integration" CMP annual users meeting, Jan. 17, 2013, pp. 1-47, CMP, Paris, France.
"Proton Energy Requirements for M3D Layer Splitting: Rev2," Sep. 29, 2014, pp. 1-10.
"Report on S3S14," 2014 IEEE SOI-3D-Subthreashold Microelectronic Technology Unified Conference, Oct. 6-9, 2014, pp. 1-11.
K. Torki, "3D-IC Integration," CMP annual users meeting, Jan. 17, 2013, Paris, France.

* cited by examiner

THREE DIMENSIONAL INTEGRATED CIRCUIT

CROSS-REFERENCE TO RELATED APPLICATIONS

The instant nonprovisional patent application claims priority to each of the following provisional applications, both of which are incorporated by reference in their entireties herein: U.S. Provisional Patent Application No. 62/101,954, filed Jan. 9, 2015, and U.S. Provisional Patent Application No. 62/120,265, filed Feb. 24, 2015.

BACKGROUND

The present invention relates generally to the manufacture of integrated circuit devices. More particularly, the present invention provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, digital signal processing devices, application specific devices, controller devices, communication devices, and others.

SUMMARY

According to the present invention, techniques generally related to the manufacture of integrated circuit devices are provided. More particularly, the present invention provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, application specific devices, controller devices, communication devices, and others.

A method comprises providing a first substrate having dielectric structures and conductive structures. Ions are implanted into the first substrate, the ions traveling through the dielectric structures and the conductive structures to define a cleave plane in the first substrate. The first substrate is cleaved at the cleave plane to obtain a cleaved layer having the dielectric structure and the conductive structures. The cleaved layer is used to form a three-dimensional integrated circuit device having a plurality of stacked integrated circuit (IC) layers, the cleaved layer being one of the stacked IC layers.

Three-dimensional stacking and interconnection of heterogeneous and non-uniform layers, such as fully fabricated integrated circuits are provided. Techniques are included for a substantial reduction in inter-layer separation and increase in the available inter-layer connection density, leading to increased signal bandwidth and system functionality, compared to existing chip stacking methods using interposers and through-Silicon vias (TSVs). The present techniques extend the use of high-energy proton implants for splitting and layer transfer developed for homogeneous materials, such as the fabrication of Silicon-on-Insulator (SOI) wafers, with modifications appropriate for layer transfer of heterogeneous layers and consideration for damage effects in device structures.

In an example, the present invention provides techniques including a method for fabricating an integrated circuit. The method includes providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface, although there can be variations. The method includes forming an unpatterned photoresist material overlying the bonding interface provided from the dielectric material. In an example, the unpatterned photoresist material is configured to shield one or more of the plurality of transistors from electromagnetic radiation in a wavelength range of below 400 nm and to selectively adjust a depth of a subsequent implanting process. The method subjects the unpatterned photoresist material to the implantation process to introduce a plurality of hydrogen particles through the unpatterned photoresist material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less. The method removes the unpatterned photoresist material after the hydrogen implant step. The method bonds the surface of the dielectric material overlying the transfer device to a transfer substrate to temporarily bond the semiconductor substrate to the transfer substrate.

In an example, the method subjects sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region. The energy can be provided spatially or globally as described in U.S. Pat. No. 6,013,563 (the '563 patent) assigned to Silicon Genesis Corporation, claims priority to May 12, 1997, and lists Francois J. Henley and Dr. Nathan Cheung, as inventors, commonly assigned, and hereby incorporated by reference in its entirety. In an example, the method subjects the hydrogen damaged region overlying the transfer device to a smoothing process to remove a portion or all of the hydrogen damaged region and to form a backside surface. In an example, the method forms a thickness of dielectric material overlying the backside surface.

In an example the backside surface is configured with one or more provisions for formation of an inter-layer conductive path linking to a bottom landing pad in the structured metal layer of the transfer device and a landing pad for a bonded conductive path to an adjacent device layers.

In an example, the method further comprises depositing a dielectric layer to form a suitable bonding interface on the structured metal layer, the structured metal layer comprising a 5 to 10 microns thick conducting layer formed over a densely patterned metal interconnect multi-layers for provision of a device power signal, a ground signal and a frequency synchronization signal, and the dielectric layer having a plurality of conductive paths through the dielectric layer on for bonding with inter-layer conductors in an upper, transfer device layer.

In an example, the method further comprises aligning of the transfer device layer to the semiconductor substrate to permanently bond the inter-layer conducting path. In an example, the method further comprises removing the temporary bonded semiconductor substrate from the transfer device. In an example, the method further comprises forming an internal flow path to allow coolant to traverse there through to cool the transfer device. The inter-layer coolant channels may be formed by use of a patterned photo resist layer added over the unpatterned photoresist layer. The thickness and/or location of the patterned photo resist layer may be chosen to adjust the local penetration depth of the proton beam to form a non-planar cleave surface in the substrate containing the top surfaces of the coolant channels, with the bottom surface provided by the lower bond plane.

In an example, the plurality of transistor devices are selected from at least one of CMOS devices, bipolar transistors, logic devices, memory devices, digital signal processing devices, analog devices, light absorbing and imaging devices, photo-voltaic cells or micro-electrical mechanical structures (MEMS), or any combination thereof.

In an example, the implantation process, proton energy ranges from 500 kilovolts to 2 MeV. In an example, the cleave region is positioned 1 to 10 microns from a top surface of the dielectric material. In an example, the unpatterned photoresist material is selected with high absorptivity of electromagnetic radiation with a wavelength less than 400 nm. In an example, the semiconductor substrate comprises a silicon or other suitable material for formation of electrical, optical or electromechanical devices.

In an example, the implantation process is provided at a dose ranging from 5E16 to 5E17 particles/centimeter2. In an example, the implantation process is provided using a beam line implanter. In an example, the implantation process is provided by a linear accelerator (LINAC) or other variation.

In an example, the cleave region having a peak concentration at an edge of an implantation range. In an example, the cleave region comprises a plurality of hydrogen gas-filled micro-platelets. In an example, the cleave region is characterized by a stress sufficient to induce propagation of an approximately planar cleave region. In an example, the cleave region is configured as a uniform implantation region or a patterned implantation region. In an example, the cleave region is patterned or graded to facilitate a controlled cleaving action.

In an example, the method comprises forming a plurality of interconnect structures between the backside surface and either the plurality of transistors or the inter-connect region. In an example, the method further comprises providing a second semiconductor substrate comprising a plurality of second transistor devices and an overlying second dielectric material; and bonding the second dielectric material configured with the second semiconductor substrate to form a stacked semiconductor structure. In an example, the method further comprises forming a patterned photoresist material overlying the unpatterned photoresist material.

In an example, the plurality of transistor devices and the inner connect region are characterized by a thickness of three microns and less; wherein the implantation process is characterized by a range of five microns to ten microns such that a characteristic size of the plurality of transistor devices and the interconnect region does not influence the implantation process. In an example, the plurality of transistor devices and the inner connect region are characterized by a thickness of three microns and less; wherein the implantation process is characterized by a range of five microns to ten microns such that a characteristic spatial dimension of the range of the implantation is not interfered by the thickness of the plurality of transistor devices and the interconnect region. In an example, the plurality of transistor devices is provided for a memory array or a logic array.

In an example, the energy is selected from thermal, mechanical, chemical, electrical, or combinations thereof to provide a cleave inducing energy. In an example, the energy is provided to cause a controlled cleaving action including an initiation of cleaving and propagation of cleaving. In an example, the energy is provided to form a plurality of micro-platelet bubbles in the cleave region. A cleave surface may connect a network of the micro-platelet bubbles The present invention achieves these benefits and others in the context of known process technology. However, a further understanding of the nature and advantages of the present invention may be realized by reference to the latter portions of the specification and attached drawings.

DETAILED DESCRIPTION OF THE SPECIFIC EXAMPLES

Figure 1:
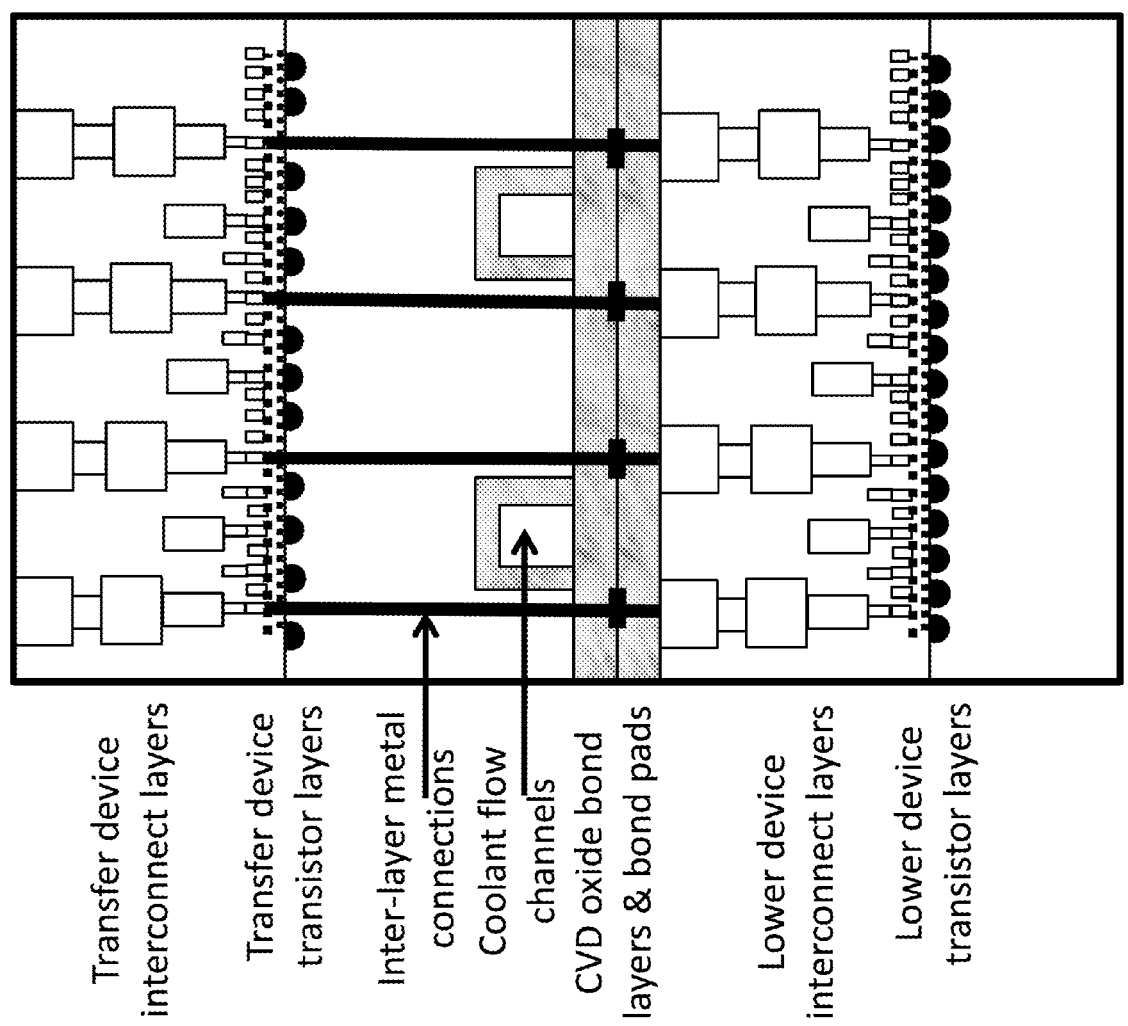
FIG. 1 is a schematic view of the present invention viewed at completion of a two-device 3D stacking process in an example.

According to the present invention, techniques generally related to the manufacture of integrated circuit devices are provided. More particularly, the present invention provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, digital signal processing devices, application specific devices, controller devices, communication devices, and others.

In an example, the present invention builds and extends the capabilities of two large areas of technology, layer transfer methods for formation of bonded stacks of homogeneous layers, such as the formation of Silicon-on-Insulator (SOI) wafers and diverse methods in present use and development to form 3-D stacks of electrical devices through the use of complex interposer layers and sparse arrays of metal vias for inter-device connections.

In an example, the present invention provides for methods of stacking and interconnection of diverse electrical and electro-mechanical layers with simplified bond and interconnect structures with physical scales that are a factor of 10 or more smaller than presently available interposer/TSV methods and providing for greatly increased number of inter-device electrical connection paths, resulting in greatly expanded data transfer bandwidth and 3-D device functionality. The present invention also provides for protection of sensitive device layers from harmful ultraviolet radiation associated with the use of high-energy proton beam lines and for construction of inter-level networks of coolant flow channels for removal of heat from the volume of the functions 3-D device stack. Further details of the present invention can be found throughout the present specification and more particularly below.

Embodiments may combine Silicon-On-Insulator (SOI) wafer formation approaches utilizing techniques such as H-cut separation and plasma-activated bonding to achieve a room temperature transfer process, combined with Si separation utilizing MeV proton technology, to achieve full-CMOS 3D stacking.

Such Layer-Transfer (LT) applied to 3D Wafer-Scale Packaging (WSP) can allow substantial benefits due to its high parallel connectivity and ability to use different processes. Embedded RAM/Cache layers are a natural application.

Conventional WSP approaches may experience challenges in one or more of the various areas of: bonding, layer alignment, layer thinning, and layer strata interconnect. For example, layer thinning to less than 10 um can desirably lead to vias with smaller aspect ratios.

Use of plasma fusion bonding allows favorable alignment. And, embodiments as described herein may make layer alignment and interconnect practically achievable goals.

Embodiments utilizing LT technology involving cold processing, allow processing of wafers with Interlayer Dielectric (ILD)/metal interconnects. The plasma-activated fusion bond confers bond strength, ultra-thin bond, no glue layers. As described below, fast thinning operation is possible, without necessarily requiring chemical mechanical polishing (CMP), polishing, or grinding operations.

Embodiments may be compatible with a variety of IC processes, including those used to fabricate complementary metal oxide semiconductor (CMOS) and Random Access Memory (RAM) devices, etc.

The use of implantation at MeV energies allows thicker implantation through an entire device layer (10 ums). Thus, a full CMOS device layer can be transferred instead of partial layers.

Implant scanning techniques may be used. Examples can include obtaining channeling improvements through "dithering".

Utilization of MeV protons by embodiments for full CMOS Stacking, may offer certain benefits. Embodiments may allow avoidance of shadowing due to CMOS layers that include transistor, dielectric, and/or metal layer structures.

A 1 MeV proton beam is sufficient to perform H-cut implants through 8 Cu metal interconnect layers and a full-depth CMOS microprocessor unit (MPU) with ≈10 um Si penetration.

Such a 10 um depth in Si, for a 1 MeV proton beam through a model 8-layer Cu interconnect array and connected CMOS transistor layer, is more than adequate for separation of damage peak from CMOS device region. A figure of merit for the desired minimum separation below the CMOS transistor layer of the proton damage region and bond oxide surface of the transferred layer substrate layer is the depletion depth into the substrate material of a biased, powered on, bulk CMOS array, on the order of 1 micrometer for a 1 V supply voltage and a 10 Ohm-cm substrate material. CMOS transistor layers comprising bulk "finFET" and "fully-depleted SOI" devices can have somewhat thinner substrate depletion thickness, depending on the device design and supply voltage. Relative precision (straggling/range) of 1 MeV proton profiles is much sharper than standard SOI wafer fabrication implants (at ≈40 keV).

It is further noted that H peak depth can be reduced by spin-on resist absorber layers. This aspect is further described in connection with FIGS. 1-9 discussed later below.

Figure 10:
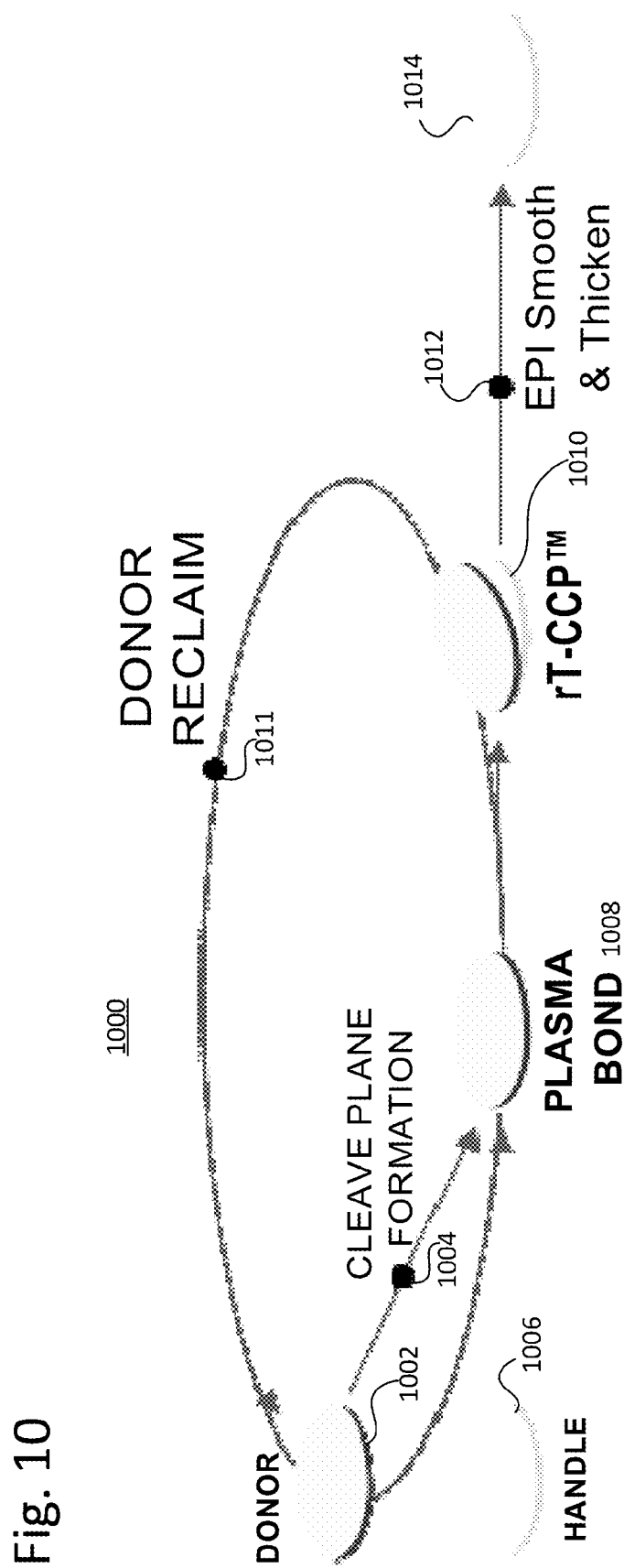
FIG. 10 shows one example of a process flow for preparing a separable substrate according to an embodiment.

FIG. 10 shows one example of a process flow 1000 for preparing a separable substrate according to an embodiment. Here, a donor substrate 1002 is subjected to cleave plane formation 1004, e.g., by the implantation of hydrogen ions.

Then, the donor substrate including the cleave plane is bonded to a handle substrate 1006, e.g. by a plasma-activated bonding process 1008. Next, the LT occurs by the performance of a room Temperature—Controlled Cleaving Process (rT-CCP™), such that a portion of the donor remains with the handle substrate. Alternatively, a portion of the donor may remain with a temporary carrier substrate if this layer is to be retransferred again to a permanent handle substrate (e.g., for back side illumination CMOS image sensors).

The remaining portion of the donor substrate is reclaimed 1011 for further use. The handle including the transferred layer 1010 may be subjected to further processing—e.g., epitaxial (EPI) smoothing and thickening 1012, to produce the separable substrate 1014.

Figure 10A:
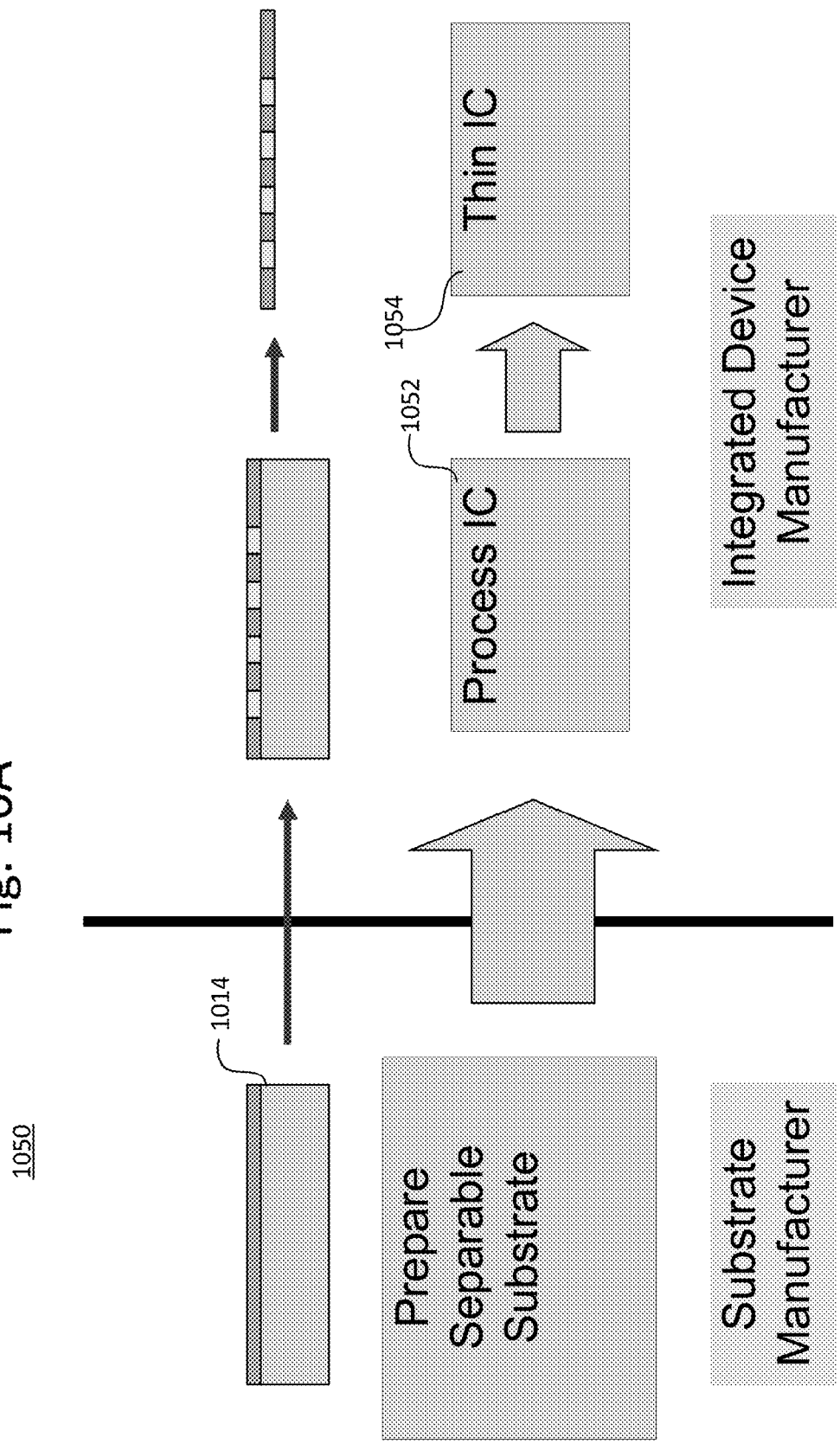
FIG. 10A shows IC processing and/or thinning steps performed downstream of the process flow shown in FIG. 10.

FIG. 10A shows a simplified process flow 1050 illustrating downstream steps performed upon the substrate provided by a substrate manufacturer of FIG. 10. Those steps may comprise IC processing 1052 (see, e.g., FIG. 11 below) and/or thinning 1054 (see, e.g., FIGS. 12-15 below).

Figure 11:
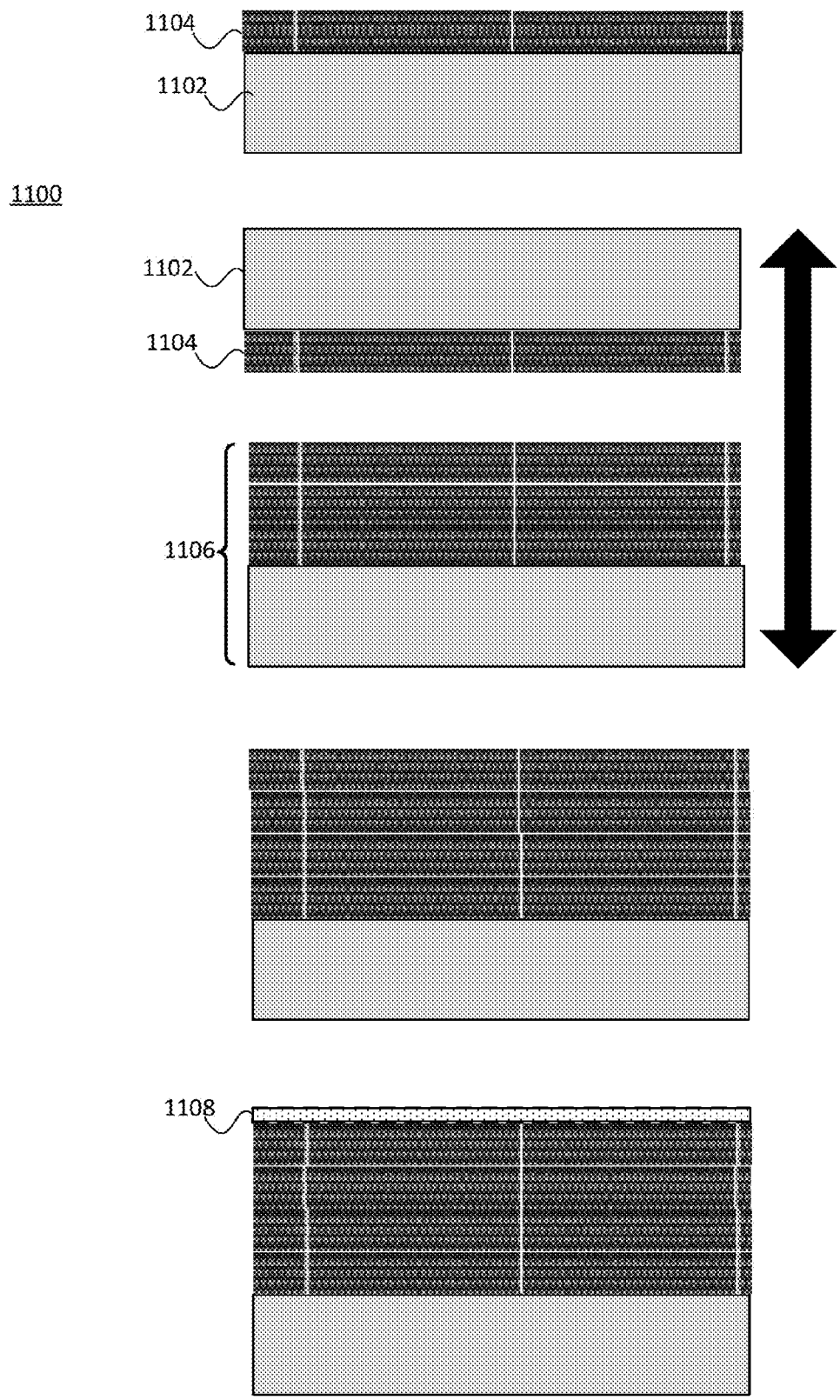
FIG. 11 shows a simplified view of a general IC process flow according to an embodiment.

Specifically, FIG. 11 shows a simplified view of a general IC process flow 1100 according to an embodiment. Here, the IC Maker received "special wafer" 1102 and processes IC layer "n+1" 1104 without any modifications.

Then, the IC layer is bonded onto the Wafer Scale Processing (WSP) stack (1 to n) 1106. After bonding, the wafer 1102 can be released.

Shown last in FIG. 11 is the performance of steps to such as interconnect processing, Chemical Mechanical Polishing (CMP), etc. to finish a layer 1108. This can be repeated for a layer "n+2".

At least four layer transfer (LT) packaging variants are possible. FIGS. 12-15 describe four options of LT for thinning.

Figure 12:
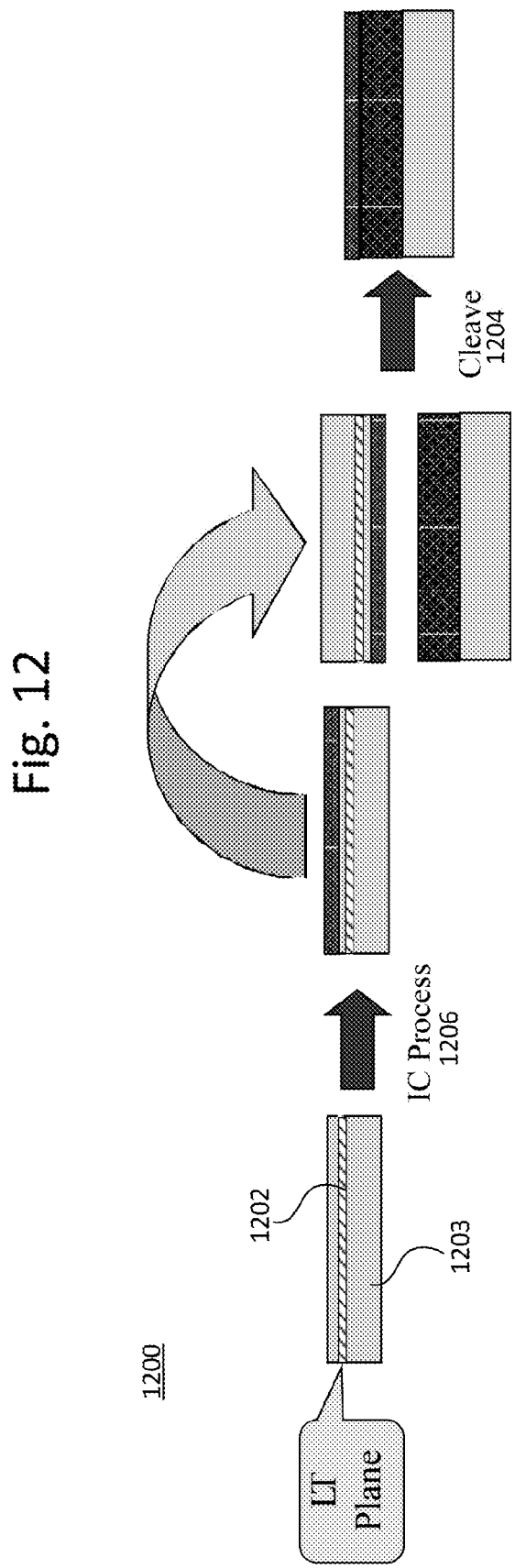
FIGS. 12-15 show simplified processing flows according to various alternative embodiments.

FIG. 12 shows an embodiment of LT after IC processing. The simplified process flow 1200 shown in this figure involves putting a cleave plane 1202 within the substrate 1203, and then cleaving 1204 after IC processing 1206. It requires more intrusive post-IC process steps.

Figure 13:
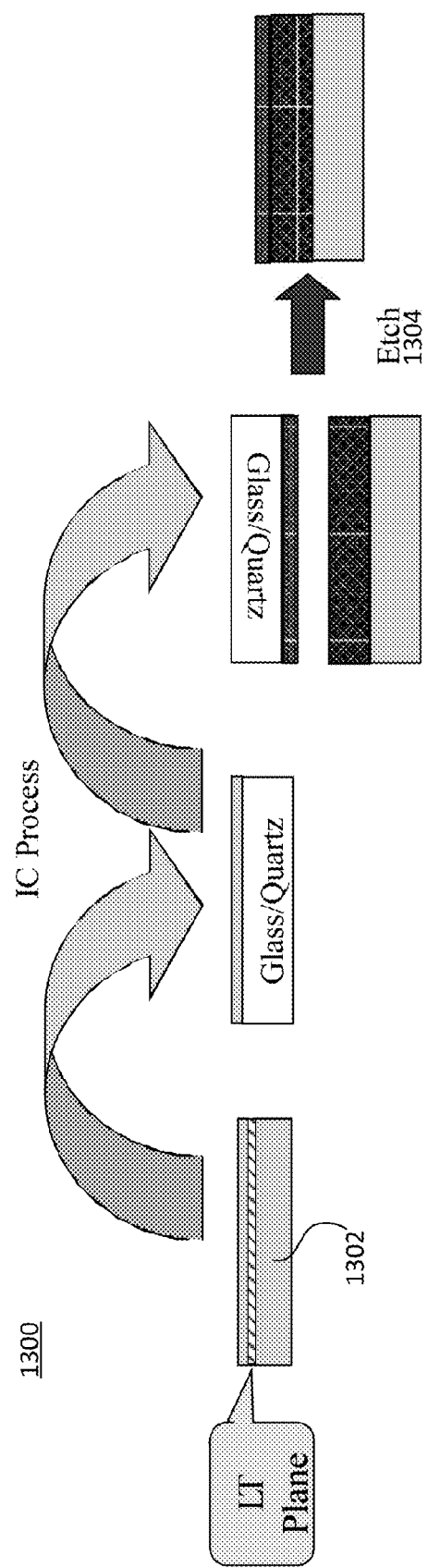

FIG. 13 shows an embodiment utilizing cleave onto an etchable substrate. The simplified process flow 1300 according to this embodiment allows the substrate 1302 to be more easily etched 1304 than SOI bond-grind back processes.

In such embodiments, the etchable substrate may be thin. An electrostatic (ES) chuck can be used to help stiffen cleave and handle the thin substrate. Transparent substrates can help with layer alignment.

Figure 14:
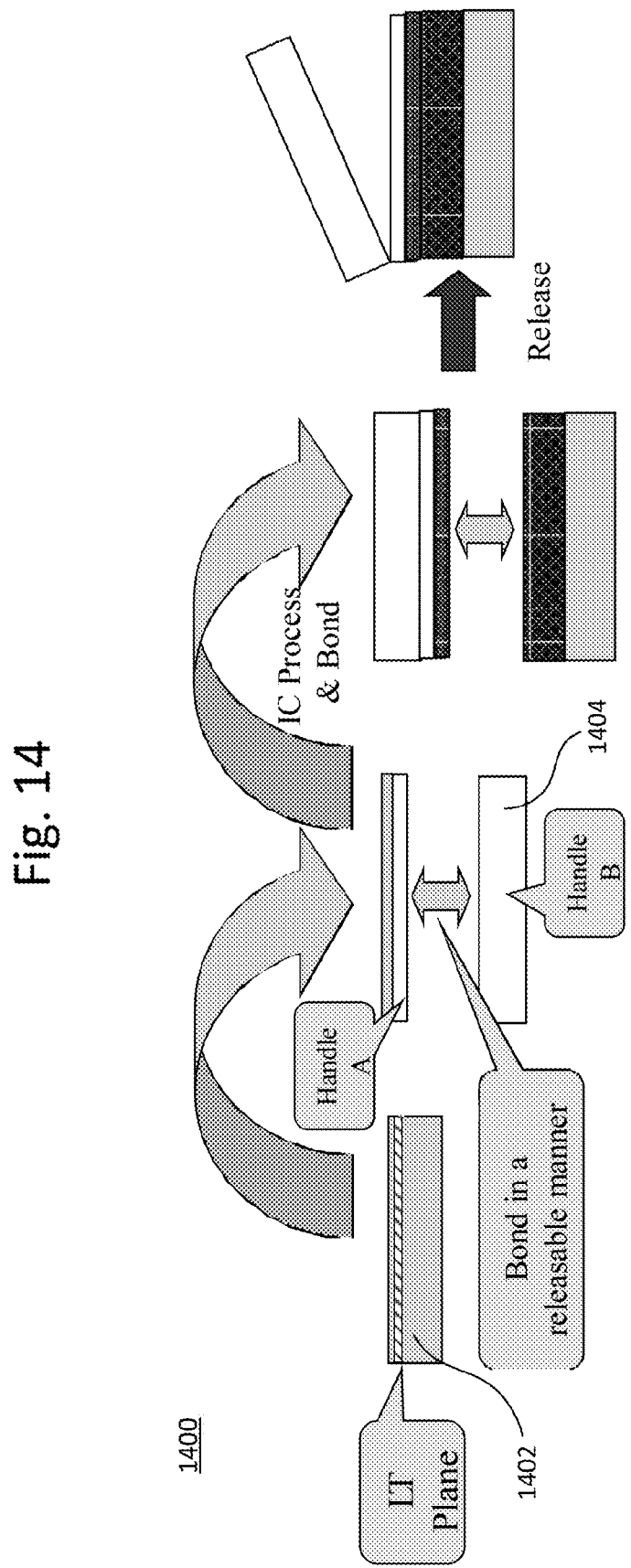

FIG. 14 shows an embodiment of a process flow 1400 where the substrate 1402 comprises a "thin" substrate attached to a releasable base substrate. The thin substrate can be utilized in the final 3D product. The releasable substrate is solely used for handling during the IC process.

Figure 15:
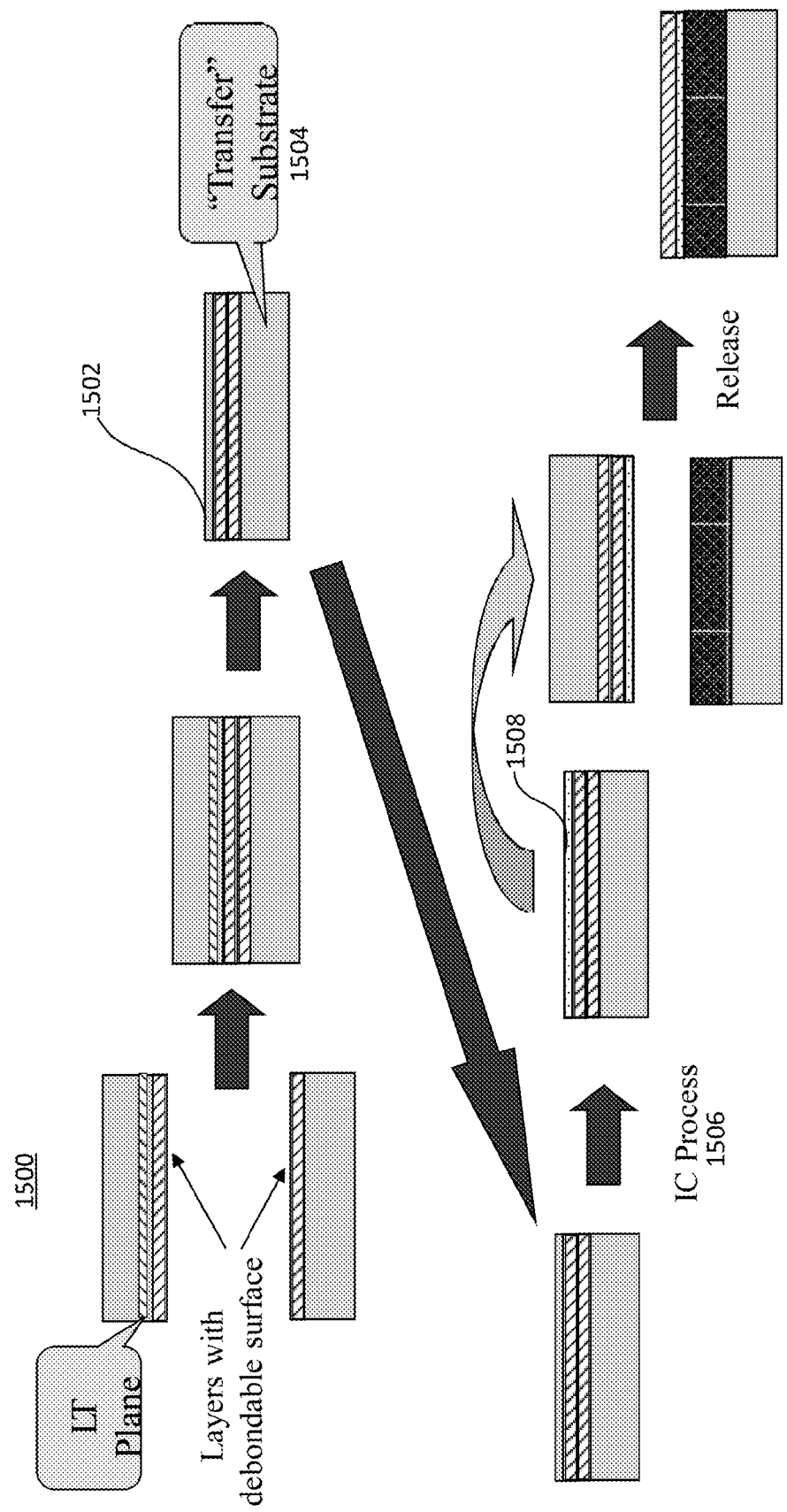

FIG. 15 shows a simplified process flow 1500 according to another embodiment. Here, the silicon film 1502 is mounted to a releasable substrate 1504. The releasable substrate is solely used for handling during IC process 1506 resulting in processed layer 1508. An internal release layer is used after LT. The release layer is put within the bond plane. LT is used to release the processed Si-layer, followed by thickening if necessary.

Certain features and benefits may accrue with one or more embodiments of the inventions. For example, H-cut splitting and layer transfer techniques may be extended to beyond lamination of uniform composition layers to enable wafer-scale stacking of heterogeneous and non-uniform individual layers, with the specific application of intimate stacking of fully-fabricated integrated circuits, including transistor layers and multi-layer interconnect networks.

Embodiments may achieve high data transfer bandwidth with high-density inter-die interconnect with thin device stacking using "intimate bonding" with H-cut and layer transfer techniques.

Embodiments may increase manufacturability and device yield by use of room to modest-temperature process throughout the stacking process.

Certain implementations may be associated with inventions according to various embodiments. Some implementations may outline device layer lamination with H-cut and plasma-bonding operations (using high-alignment accuracy bonding tools).

Particular embodiments may utilize variations on front-back stack and front-front stack bonding, with corresponding interconnect depths and locations.

Some embodiments may thin total device layer elements (no need for interposers), with decreases in RC losses even for high-density inter-device via connections.

Various embodiments may lower stress via connections with much reduced "keep out" area from Cu/Si stress.

Certain embodiments may implement methods for post-splitting damage layer removal and substrate thickness reduction (selective etching)—appropriate for bonding and heat transfer requirements (much less stringent than SOI wafer layer lamination).

Certain additional factors of particular embodiments are also now described. Some such factors may deal with non-uniform total Cu-interconnect thickness in various IC designs.

For example, metrology can be used. A scan effect of non-uniform Cu density collects backscattered proton current from a large-angle collection electrode facing IC metal surface with a $\approx 1 \times 1$ um$^2$ aperture for MeV proton beam. A precision stage scanner for IC motion under aperture maps out net Cu density by backscatter current.

Design rules can be used to address non-uniformity. These design rules may specify allowable variations in total Cu thickness across IC device areas. Note: limitation is on cleave plane roughness (and ability of post-splitting damage removal process to recover a bondable surface). Wafer-level splitting can be achieved with large-area checkerboard H distributions.

A manufacturing process can be used to address non-uniformity. For example, a "dummy" Cu layer material may be added at positions of low-Cu thickness, such as inter-layer metal via channels.

Embodiments may set the cleave plane depth, not directly affected by proton energy or variation in total Cu-layer densities, by constructing IC devices over a high-stress epi layer, such as a graded Si—Ge thin layer, to localize post-stopping H concentration along high-stress interfaces. The cleave plane will be set by the location of the high-concentration H distribution accumulated at the built in high-stress interface.

Total proton dose and related risk of dielectric bond damage (in low-k interconnect and high-k gate dielectrics) from electronic stopping events may be reduced, by increasing proton lattice damage accumulation (via nuclear stopping events) by lowered wafer temperature during proton implantation.

1A. A Method, comprising:
  providing a first substrate having dielectric structures and
    conductive structures;

implanting ions into the first substrate, the ions traveling through the dielectric structures and the conductive structures to define a cleave plane in the first substrate; and cleaving the first substrate at the cleave plane to obtain a cleaved layer having the dielectric structure and the conductive structures, wherein the cleaved layer is used to form a three-dimensional integrated circuit device having a plurality of stacked integrated circuit (IC) layers, the cleaved layer being one of the stacked IC layers.

The method of clause 1A, wherein the implantation is performed while keeping the first substrate at a temperature of 500 degrees Celsius or less.

The method of clause 1A, wherein the implantation energy is greater than 100 KeV and the ions are protons.

The method of clause 3A, wherein the implantation energy is 300 KeV or greater.

The method of clause 3A, wherein the implantation energy is 500 KeV or greater.

The method of clause 3A, wherein the implantation energy is 1 MeV or greater.

The method of clause 1A, wherein the dielectric structures and the conductive structures are formed on the first substrate by performing a plurality of processing steps on the first substrate.

As mentioned above, certain embodiments may reduce H peak depth by spin-on resist absorber layers. This is now discussed below.

FIG. 1 is a schematic view of the present invention viewed at completion of a two-device 3D stacking process. The upper device layer, containing heterogeneous layers of transistors formed in semiconductor materials, usually Si, and a dense network of metal, usually Cu with various other metals for liners and vias, layers separated by low-dielectric constant electrical insulator materials, is separated from a semiconductor wafer after formation processing by hydrogen implant and associated cleaving process. During proton implant, the transfer device structure is covered with a uniform photoresist layer of sufficient thickness and properties to protect the device layers from damaging exposure to ultra-violet radiation from recombination processes in the proton beam line plasma. For the case shown in FIG. 1, the transferred device layer is also coated with a second photoresist layer patterned to adjust the depth of the proton beam and the resulting cleave surface along the paths of a network of coolant flow channels designed to remove heat from the volume of the completed 3-D device stack. Conductive structures include transistor junctions in the substrate and a metal interconnect network contacted to the transistor layer.

After mounting of the upper device layer to a temporary bond handle waver, the cleaved lower surface of the transfer device is processed to remove implant damage in the region of the cleave surface and adjust the thickness of the transfer device substrate layer. Then a CVD oxide layer is deposited on the lower surface to provide an efficient bonding surface and to provide an electrically insulating and passivated surface for the coolant flow channels, if present. The lower device surface is then etched and filled with metal to form inter-level electrical connection to the transfer device interconnect layers, through a substrate and deposited oxide layer thickness of the order of 1 or more microns. The inter-level metal lines in upper transfer device layers are terminated with metal bond pads with bond surfaces at the same plane as the deposited oxide bonding layer.

A similar deposited oxide is formed on the lower device top surface to provide efficient bonding, a network of vias are etched and filled with metal to provide electrical connections with the lower device interconnect layers. The lower metal lines are terminated by metal bond pads at the same plane as the lower deposited oxide surface.

The two sets of metal bonding pads are aligned in a precision bonding apparatus and subjected to bond anneal processing, completing the 2-level stack shown in FIG. 1 (with coolant channels).

Figure 2:
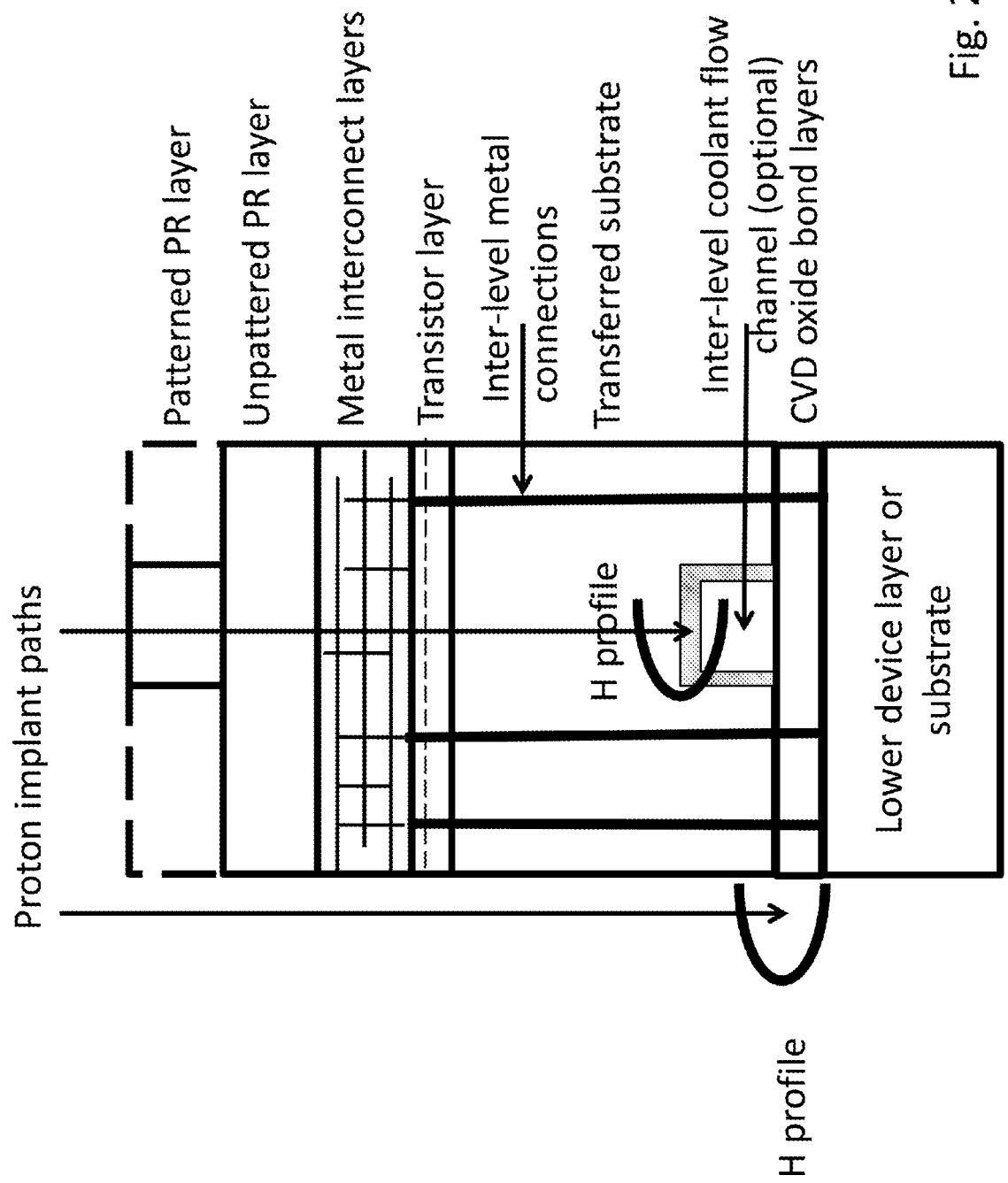
FIG. 2 illustrates a heterogeneous structure containing a layer of transistor devices and an upper network of metal and low-dielectric constant materials, with provisions for inter-layer coolant channels provided by implantation through an additional, patterned photo resist layer in an example.

FIG. 2 shows a view of patterned PR and device layer after layer transfer to lower device layer. In FIG. 2, a heterogeneous structure containing a layer of transistor devices and an upper network of metal and low-dielectric constant materials providing interconnects for an integrated circuit (IC) is coated with a uniform photoresist (PR) layer, where the resist properties and thickness is chosen to provide adequate protection for sensitive IC layers and interfaces from exposure to ultra-violet (wavelength less than 400 nm) radiation arising from recombination events in the proton accelerator beam line plasma. The thickness and stopping of the uniform PR layer is also chosen to adjust the range of the proton beam to a desired depth below the IC device transistor and depletion layers.

In FIG. 2, a second, patterned, PR layer is added over the uniform PR layer with the thickness and stopping of the second PR layer chosen to locally adjust the depth of the implanted proton distribution to provide a non-planar material splitting surface. When the transferred device layer is bonded to a lower device layer, after removal of the PR layers and temporary bonding to a holder layer, the non-planar splitting surface provides a network path, reflecting the patterning of the upper PR layer, for flow of coolant in the finished IC device stack for removal of heat during device operation.

Also shown in FIG. 2 are inter-level metal vias and bonding landing pads and oxide bonding interfaces which are added to the lower section of the upper transferred device layer before bonding to the lower device layers, described in more detail in later figures.

Top absorber layers may be used to (1) locally control the depth of the peak of the proton damage profile in the transfer device substrate, thereby controlling the location of cleave surface at separation; (2) define the lateral location and depth of coolant channels formed by the depth variations in the cleave surface; and/or (3) provide a protective layer to absorb UV-radiation arising from electron capture and subsequent radiative processes by proton ions in the accelerator beam line.

Certain embodiments of this process use an un-patterned, cross-linked photo-resist (PR) layer with a second PR layer deposited above, lithographically exposed and developed to leave a patterned PR over layer.

Other embodiments of this process may use CVD deposited dielectric films. In certain embodiments, an un-patterned CVD oxide layer is deposited on the top surface of the metal interconnect network of the device layer to be transferred to the 3DIC stack. The thickness of this first CVD oxide layer may be chosen so that the combined stopping power effects of the CVD oxide, device metal interconnect network and the device substrate places the proton and damage peaks at the desired depth of the main cleave plane surface below the transfer device transistor layer.

A CVD nitride layer is then deposited on the first CVD oxide layer to act as an etch stop to protect the underlying oxide layer during the etching of the top CVD oxide layer.

Then a second CVD oxide layer is deposited on the nitride layer. The thickness of the top CVD oxide layer may be chosen to locally shift the location of the peak of incident proton beam to be shallower than the location of the main cleave surface by the desired height of coolant flow channels to be formed by the subsequent bonding of the transferred device layers to a planar bonding surface on the top of an underlying device layer in the 3DIC stack.

A PR layer may then be deposited on the top oxide, lithographically exposed and developed to leave a patterned PR over-layer. This patterned PR layer protects the top CVD oxide layer in the locations where the coolant channels will be formed during the subsequent oxide etch step, with the nitride layer protecting the lower oxide layer.

Figure 2A:
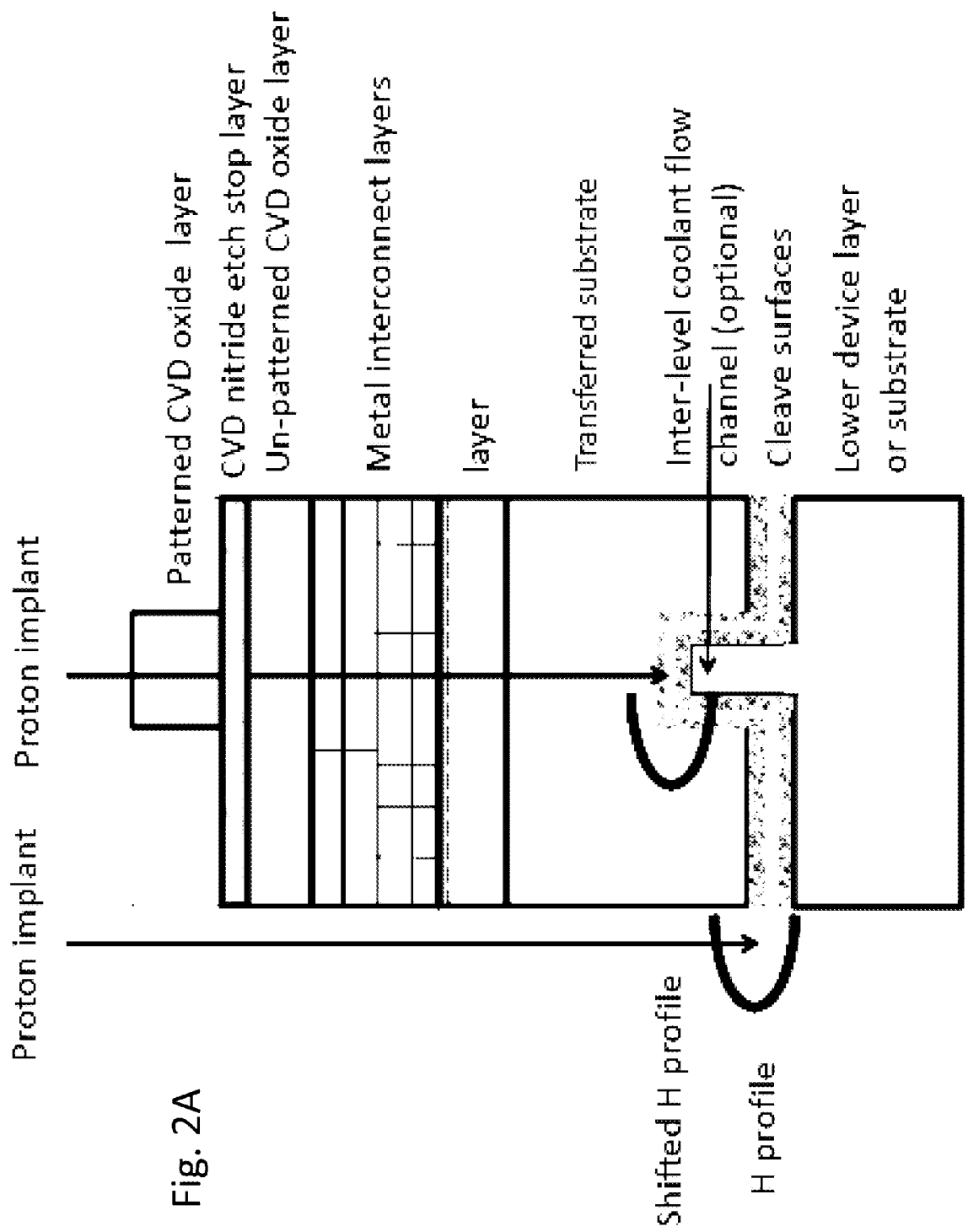
FIGS. 2A-B are simplified cross-sectional views showing use of patterned oxide as an absorber.

FIG. 2A is a simplified cross-sectional view of the transfer device layer at proton implant showing an un-patterned top CVD layer with thicknesses chosen to shift the peak of the proton profile to be at a depth of the desired location of the cleave surface. A patterned second CVD oxide layer, with thickness chosen to shift the proton beam peak to the height of the (optional) coolant channels to be formed during the subsequent bonding step to the 3DIC device stack. A CVD nitride layer deposited between the two oxide layers act as an etch stop for the top oxide patterning etch.

Figure 2B:
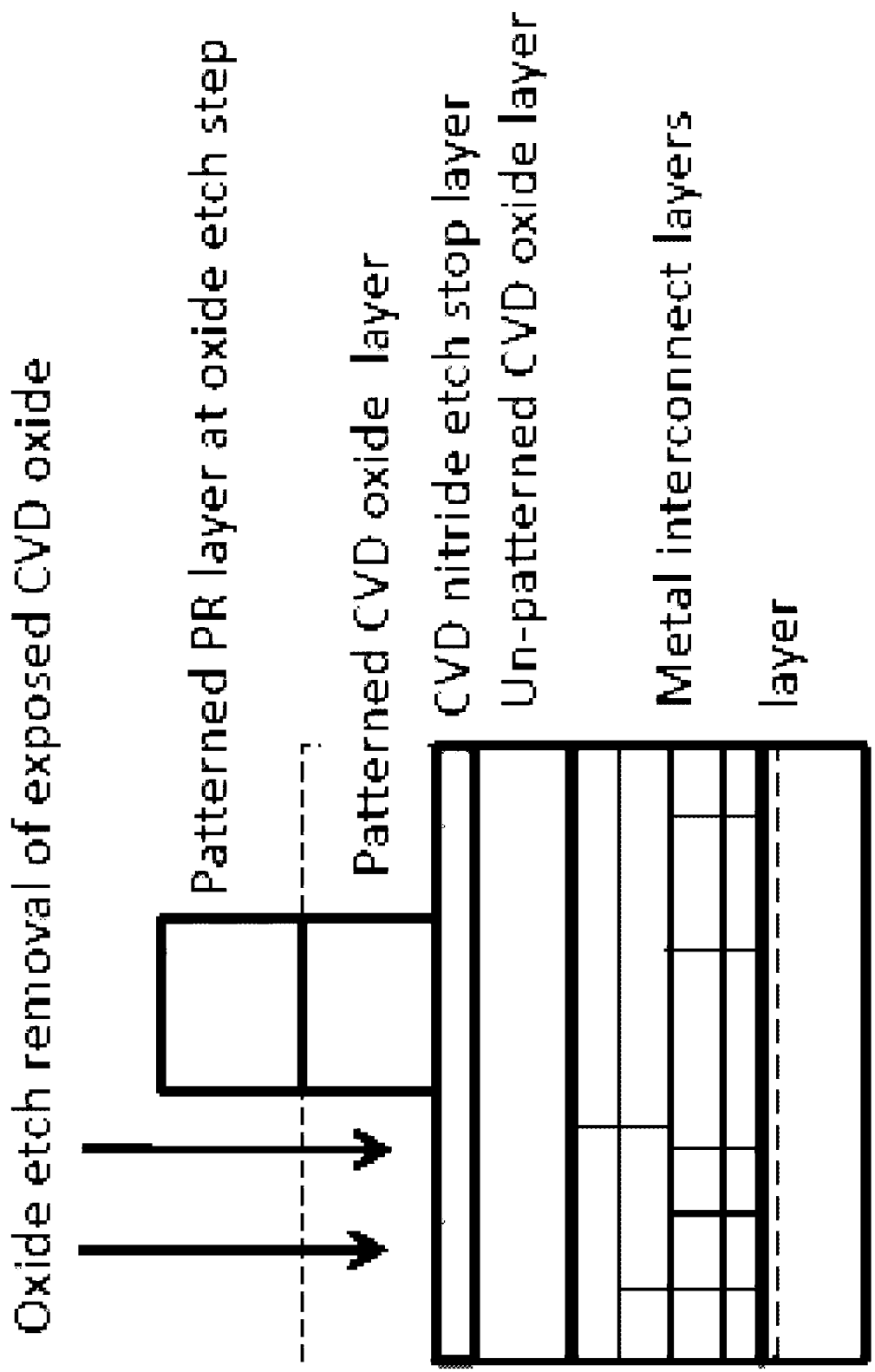

FIG. 2B is a simplified view of upper layers of the transfer device after deposition of un-patterned CVD oxide and nitride layers, deposition of a top CVD oxide and PR layers. After lithographic exposure and development of the PR pattern, exposed top CVD layer material is etched off. The nitride layer protects to the lower CVD layer from etch removal. The PR layer is removed prior to proton implant.

The use of CVD dielectric layers to form the top absorber layers may offer the manufacturing benefit of avoiding the process complications that accompany high-energy implants through polymer PR films, such as out-gassing of Hydrogen and other volatile materials due to the bond-breaking in the PR materials by collisions with the passing proton beam.

The local control of the proton implant profile into the device and substrate layer through the use of patterned and un-patterned CVD top layers can be used to compensate for local variations pattern density and total layer thickness in metal interconnect networks both across complex chip die and for processing diverse chip designs on in-process, large-area wafers. This capability for local control on the proton profile depth and location of the cleave surface at separation enables the use of a constant energy proton beam for processing of diverse device types, improving in-line wafer manufacturing efficiency.

Figure 3:
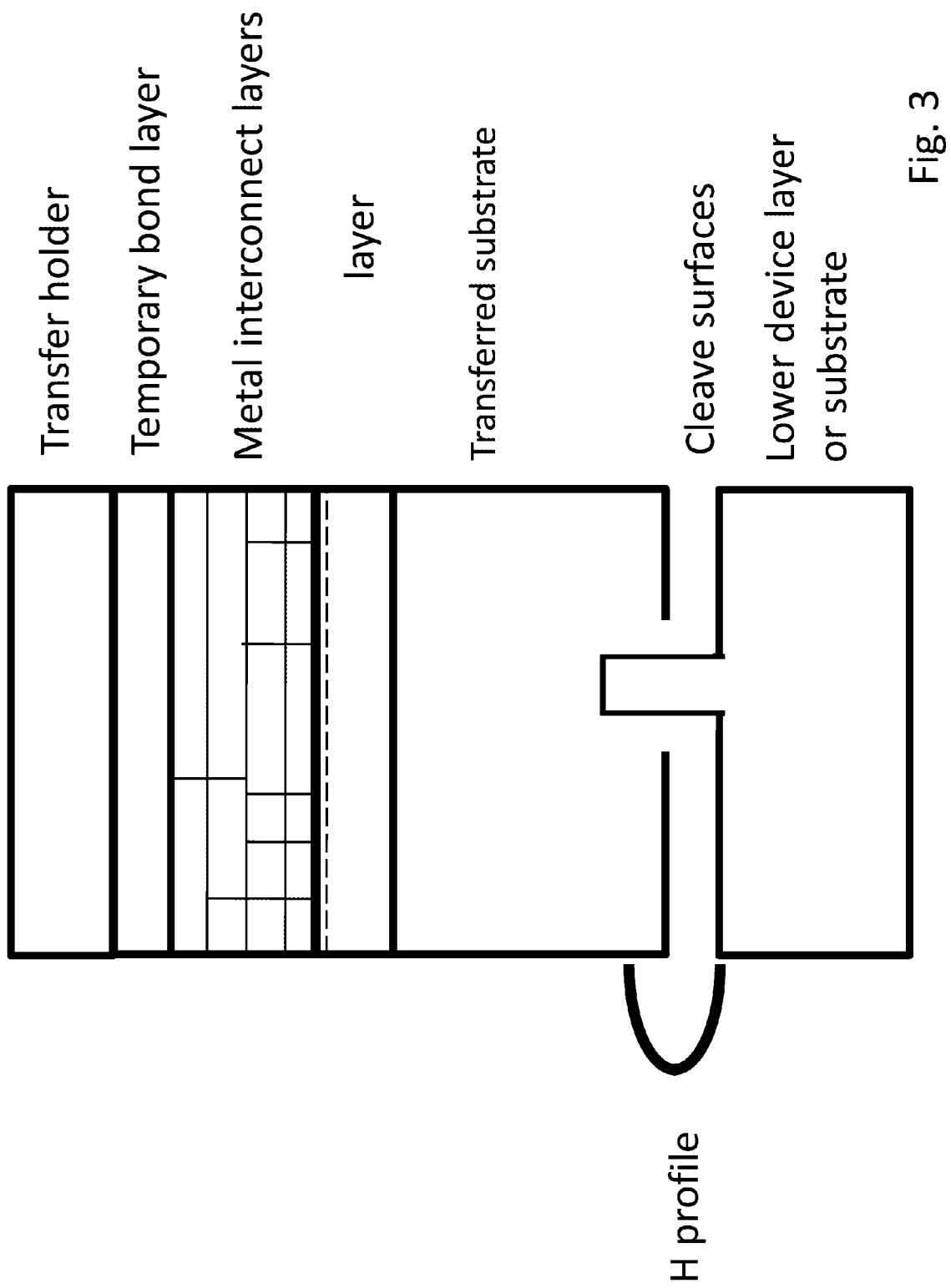
FIG. 3 is a schematic view of the transferred device layer viewed at the point of non-uniform surface cleaving after proton implants through patterned dual-layer photoresist (PR) layers, viewed after removal of the PR layers and attachment of a temporary-bonded transfer holder in an example.

FIG. 3 is a schematic view of the transferred device layer viewed at the point of non-uniform surface cleaving after proton implants through patterned dual-layer PR layers, viewed after removal of the PR layers and attachment of a temporary-bonded transfer holder. Following the non-uniform surface splitting, the damaged material surrounding the cleave planes, containing H-filled platelets and adjacent lattice damage regions, is removed and additional bottom layer material is removed leaving the desired depth of substrate material containing the IC device transistor and depletion regions.

In addition, the non-planar splitting surface is then treated with deposited oxide films to form passivated surface walls for coolant channels as well as formation of efficient bonding surfaces for attachment to adjacent device layers. The lower region of the transferred device layer is also processed to form inter-layer metal connection paths between the device layers, described in later figures and discussions.

FIGS. 4 through 9 illustrate the 3D stacking process for a generic set of IC layers using a uniform top PR layer, with no provisions for incorporated coolant channels, for simplicity. Further details of these drawings can be found throughout the present specification and more particularly below.

Figure 4:
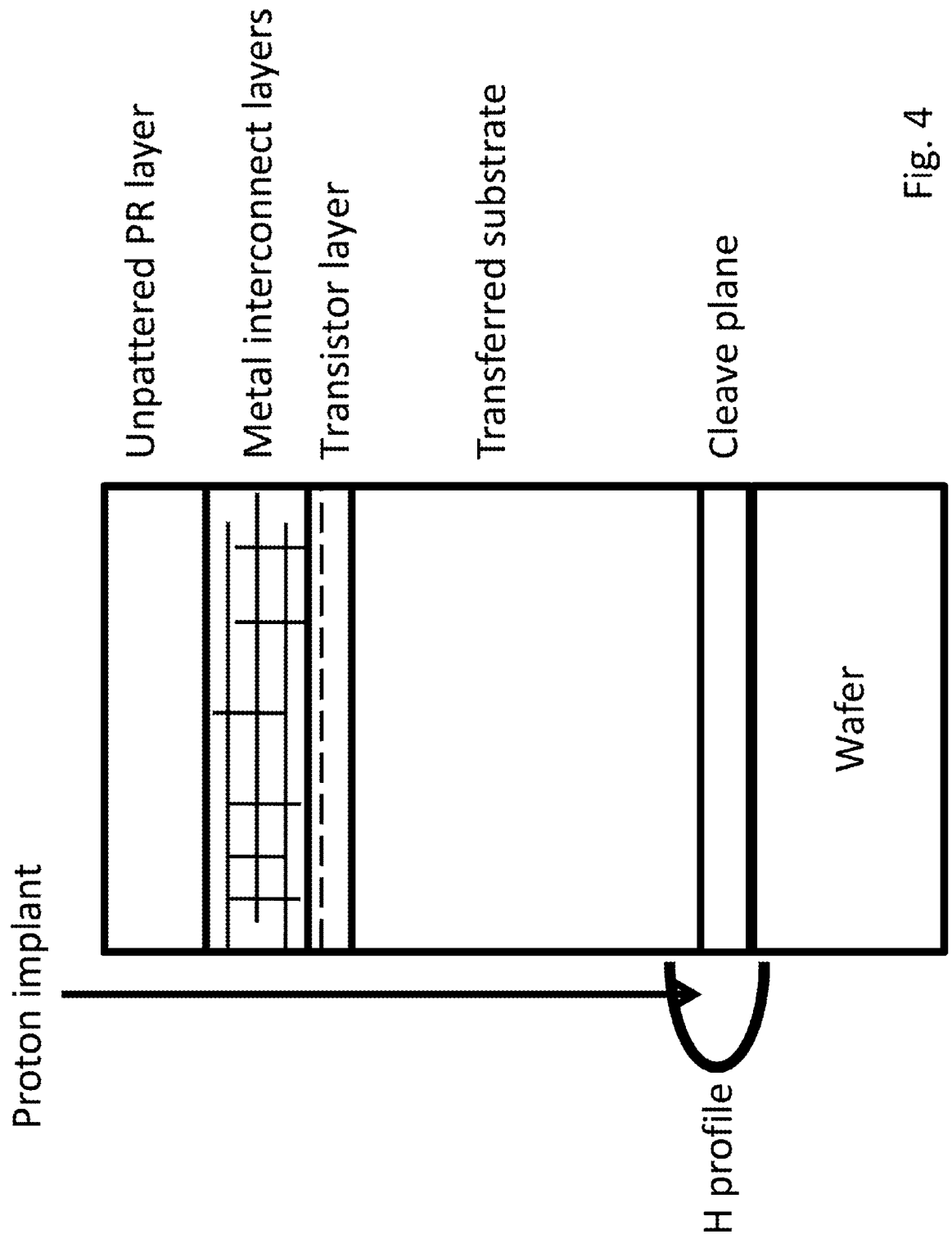
FIG. 4 sketches a to-be-transferred IC device at the point of the high-dose proton implant with a uniform PR layer in place over the device metal interconnect layers in an example.

FIG. 4 sketches a to-be-transferred IC device at the point of the high-dose proton implant, with a uniform PR layer in place over the device metal interconnect layers. The metal interconnect layers are typically a densely patterned, multilayer structure, comprising 10 to 15 layers of Cu metal, for advanced logic devices, less for memory devices. The Cu metal layers and vias are electrically isolated by interleaved layers of low-dielectric constant insulating materials. The net Cu layer thickness is typically 3 microns or less in modern practice, without the 5 to 8 micron thick metal layers used for accurate distribution of device synchronization, or "clock", signals, power and ground. Provisions for additional of thick metal interconnects are offered as part of the inter-level stacking process.

The density, optical properties and thickness of PR are chosen to provide adequate protection of the underlying device layers from exposure to uv-wavelength recombination radiation from the proton accelerator beam line plasma and to adjust the depth of the proton peak and cleave plane below the transistor doping and depletion layers.

Figure 5:
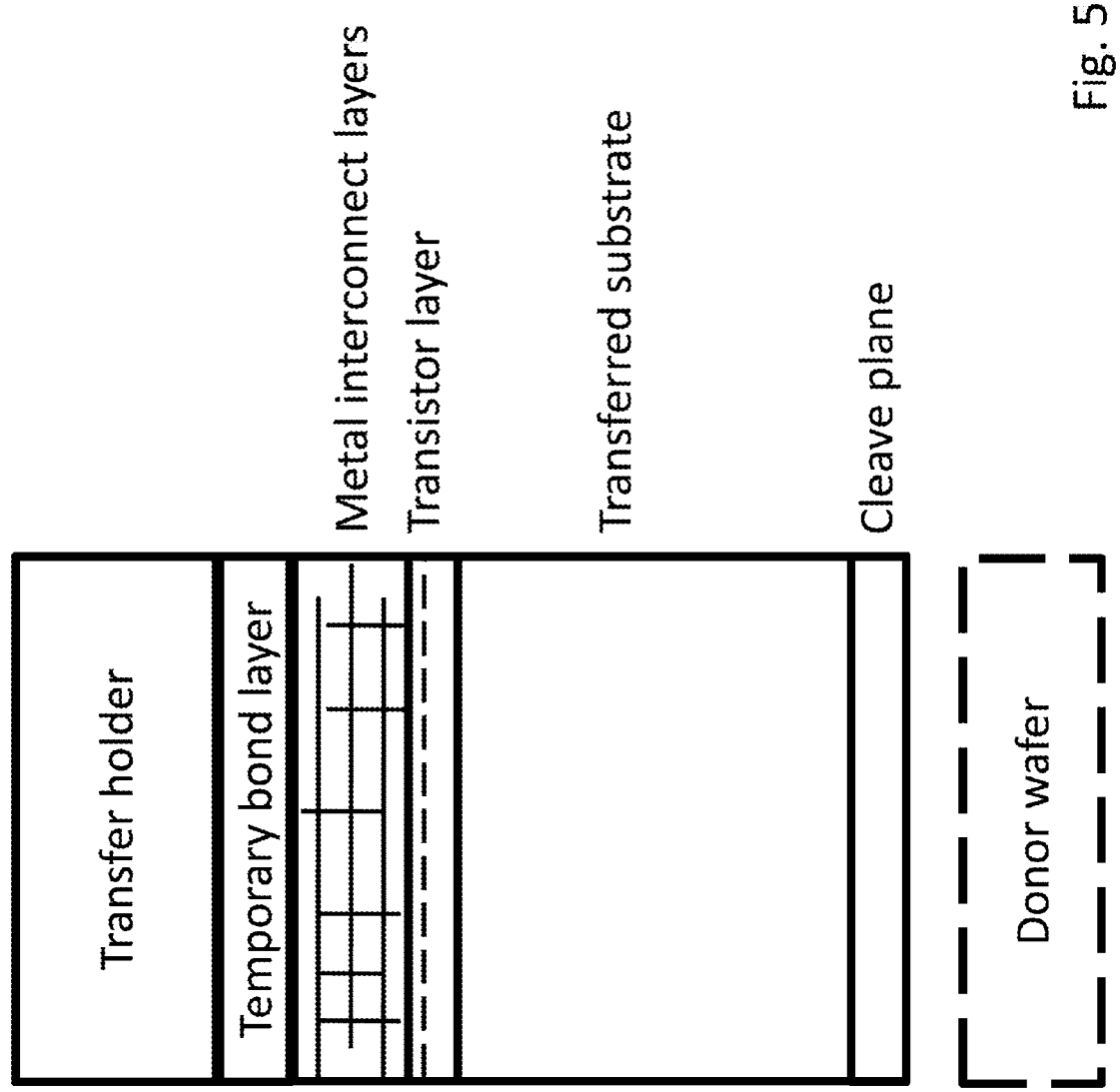
FIG. 5 is a simplified view of the transfer device layer after the proton implant, removal of the PR layer attachment of the temporary bonded transfer holder and completion of the wafer level cleaving process in an example.

A view of the transfer device layer after the proton implant, removal of the PR layer attachment of the temporary bonded transfer holder and completion of the wafer level cleaving process is shown in FIG. 5. The cleaving action can be effected by local application of energy in the form of mechanical, chemical, laser or other thermal exposure or global energy or any combination thereof. Cleaving can occur using any of the techniques disclosed in the '563 patent, which had been incorporated by reference, a blister technique, or others.

Figure 6:
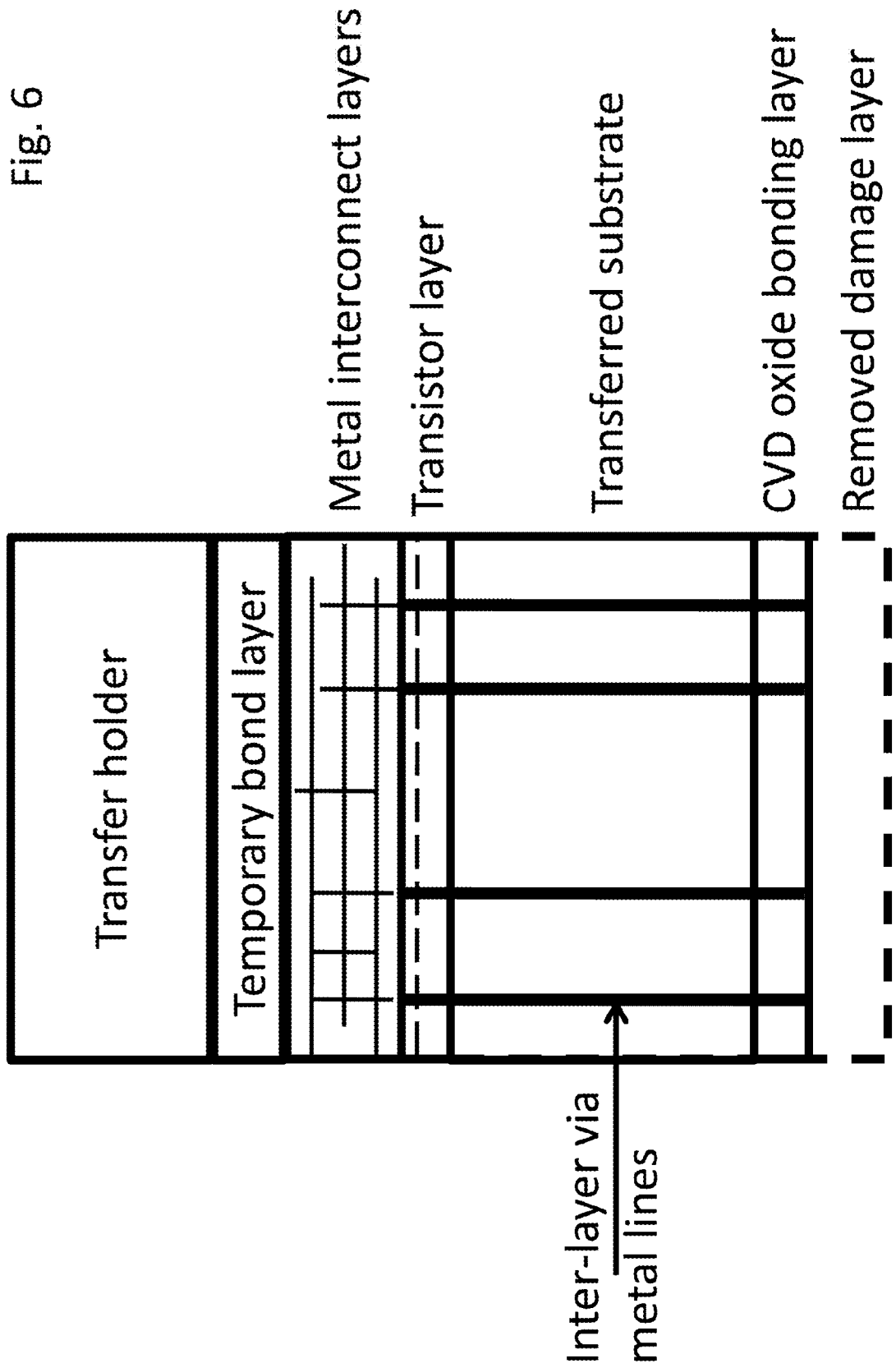
FIG. 6 shows the major steps applied to the bottom region of the transferred device layer comprising the formation of an oxide layer suitable for bonding after removal of the implant damage layer and final adjustment of the device layer substrate layer thickness and formation of the dense array of inter-layer metal connections and bonding pads in an example.

FIG. 6 shows the major steps applied to the bottom region of the transferred device layer which include removal of proton-damaged material in the immediate vicinity of the cleave plane as well as any additional material in order to obtain the desired transfer substrate thickness, formation by chemical vapor deposition (CVD) of a planar bonding interface and formation of inter-level metal lines connecting the transferred device metal interconnect network with lower bonding pads at the plane of the deposited bonding oxide interface. Inter-layer via formation is shown.

Figure 7:
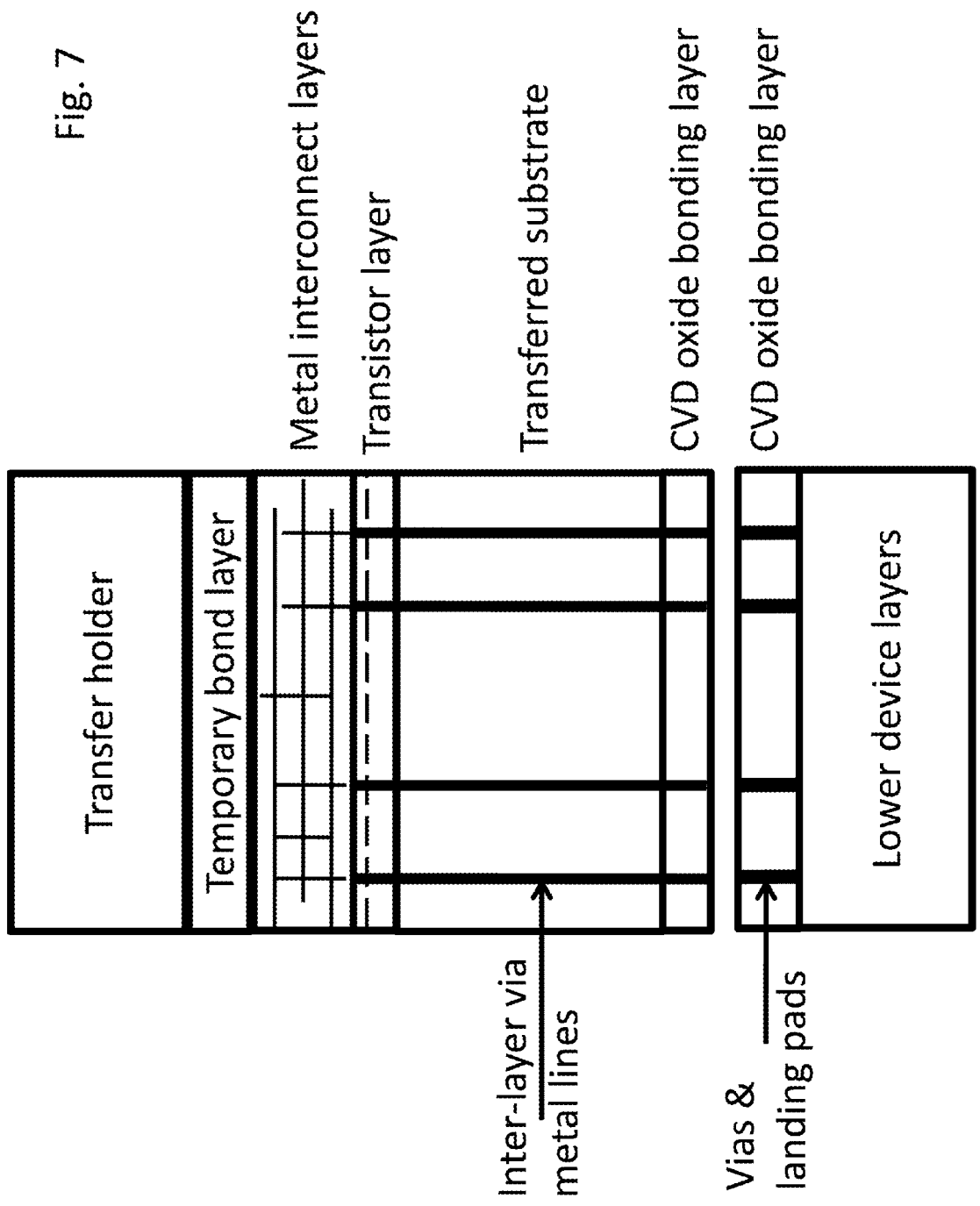
FIG. 7 shows the cleaved and prepared transferred device layer at the point of precision alignment with mating interconnect structures on the upper surface of a lower device layer in the developing 3D device stack in an example.

FIG. 7 shows the cleaved and prepared transferred device layer at the point of precision alignment with mating interconnect structures on the upper surface of a lower device layer in the developing 3D device stack. The present invention exploits the capabilities of advanced alignment and bonding apparatus with wafer level alignment tolerances in the range of 150 nm for 300 mm wafers. Vias and via landing pads are shown.

Figure 8:
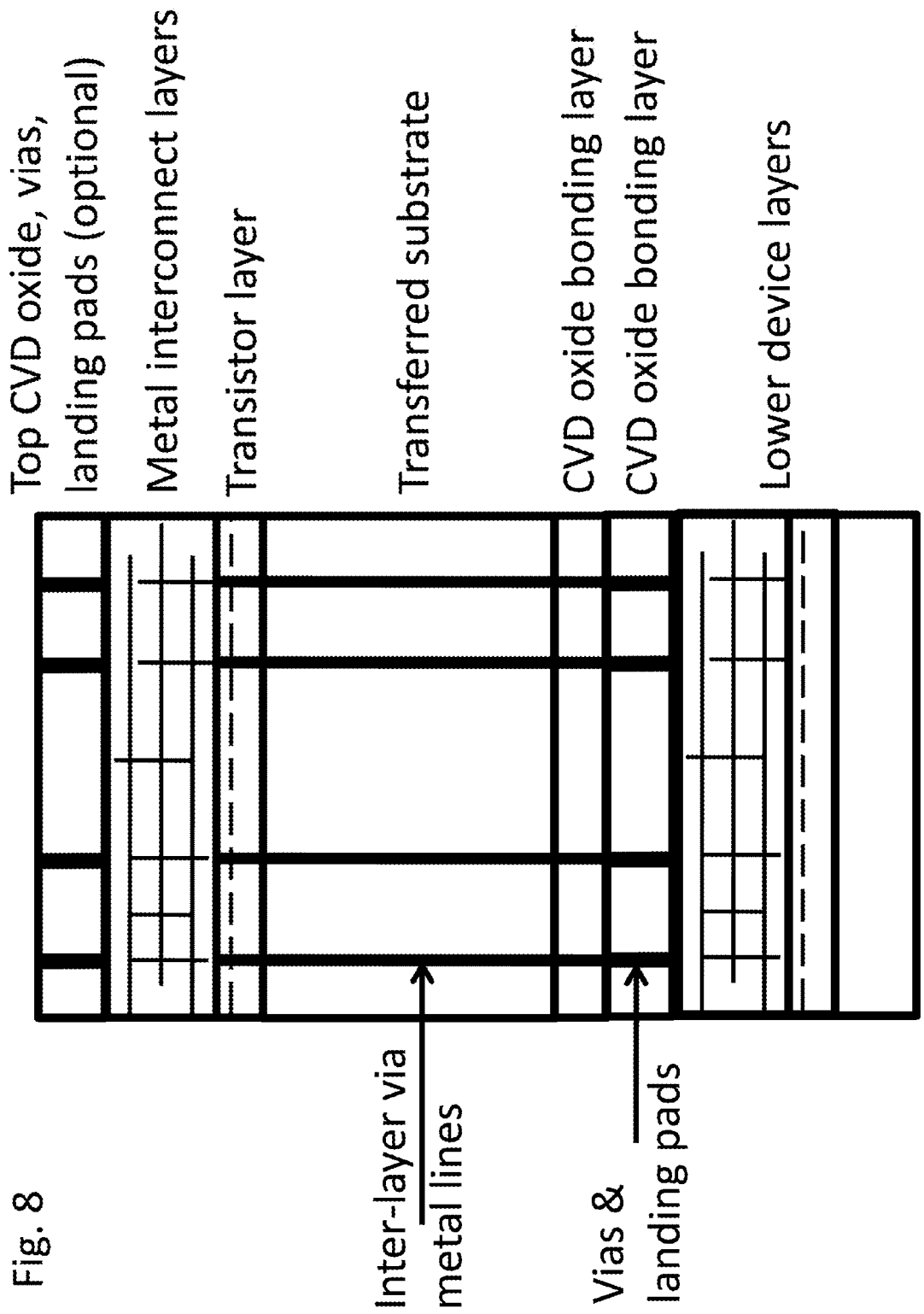
FIG. 8 shows a completed intimate 3D stack of a transferred IC device bonded to a lower device layer, with aligned inter-level metal lines in place and bonded at landing pads along the oxide layer bond interface in an example.

FIG. 8 shows a completed intimate 3D stack of a transferred IC device bonded to a lower device layer, with aligned inter-level metal lines in place and bonded at landing pads along the oxide layer bond interface. Also shown in FIG. 8 is a top deposited oxide layer with metal vias and landing pads at the bond interface level for subsequent stacking of an additional device layer on top of the present transferred device layer.

Figure 9:
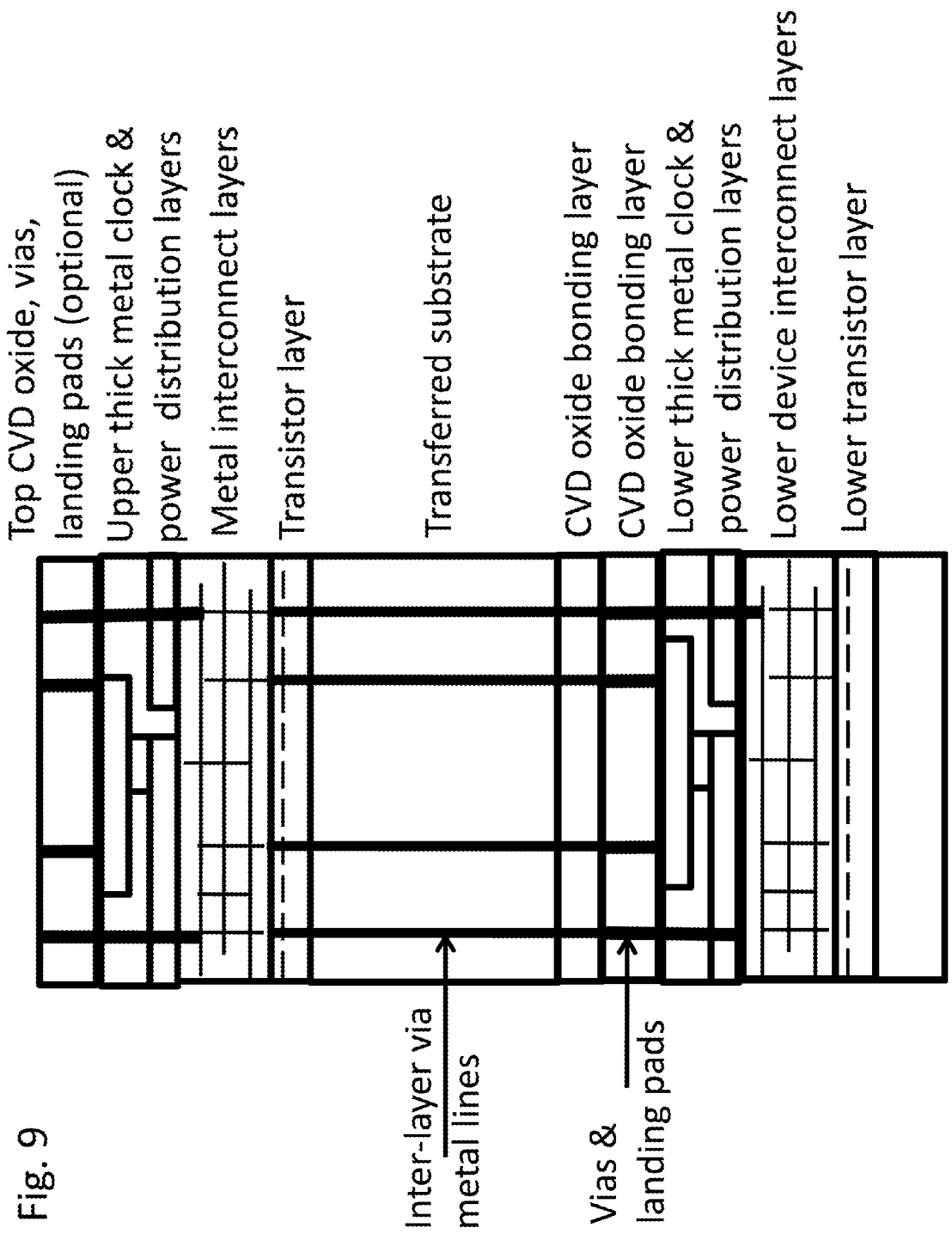
FIG. 9 shows a schematic example of two device layers stacked with thick metal interconnect layers in an example.

For 3D stacking of large-area, high performance logic IC devices, accurate delivery of power, clock and signal pulses require low-resistance paths provided by several micron thick metal lines. These metal layers are too thick to be implanted through with modest (1 or 2 MeV) energy proton beams but can be provided for, where needed, as part of the inter-level processing post implant and cleaving and before the stacking of subsequent device layers. FIG. 9 shows a schematic example of two device layers stacked with thick metal interconnect layers, the power device with the completed metal layers in place if it is the bottom device layer and the upper transferred device with the thick metal interconnects added after device transfer and permanent bonding and before the deposition of bonding oxide and formation of inter-level metal lines and bond landing pads. The dual device stack has incorporated thick metal clock & power distribution layers.

The discussion of the invention here is in terms of a stack of generic CMOS devices. A useful example is a stack of extended memory elements connected to a data transfer layer for high-bandwidth signal processing and computation, such as memory stacks presently formed with the use of interposer layers and metal connection lines, known as "Through-Silicon vias" (TSVs), with length of the order of 30 to 50 microns, over 10 times longer than the inter-level connections envisioned in the present invention.

The utility of the present invention can be exploited to provide fabrication methods for intimate 3-D stacks of diverse electrical and electro-mechanical devices incorporating heterogeneous device layers for sensing of visual images, chemical environments and diverse physical conditions combined with stacked integrated circuits to provide signal processing, memory and data transmission in an integrated and robust 3-D device.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. One of ordinary skill in the art would easily recognize a variety of alternatives, modifications, and variations, which can be used according to the present invention.

1B. A method for fabricating an integrated circuit, the method comprising:
providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface;
forming an unpatterned photoresist material overlying the bonding interface provided from the dielectric material, the unpatterned photoresist material is configured to shield one or more of the plurality of transistors from electromagnetic radiation in a wavelength range of below 400 nm and to selectively adjust a depth of a subsequent implanting process;
subjecting the unpatterned photoresist material to the implantation process to introduce a plurality of hydrogen particles through the unpatterned photoresist material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less;
removing the unpatterned photoresist material after the hydrogen implant step;
bonding the surface of the dielectric material overlying the transfer device to a transfer substrate to temporarily bond the semiconductor substrate to the transfer substrate;
subjecting sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region;
subjecting the hydrogen damaged region overlying the transfer device to a smoothing process to remove a portion or all of the portion or all of the hydrogen damaged region and to form a backside surface; and
forming a thickness of dielectric material overlying the backside surface.

2B. The method of clause 1B wherein the backside surface is configured with one or more provisions for formation of an inter-layer conductive path to linking to a bottom landing pad in the structured metal layer of the transfer device and a landing pad for a bonded conductive path to an adjacent device layers.

3B. The method of clause 2B further comprising depositing a dielectric layer to form a suitable bonding interface on the structured metal layer, the structured metal layer comprising a 5 to 10 microns thick conducting layer formed over a densely patterned metal interconnect multi-layers for provision of a device power signal, a ground signal and a frequency synchronization signal, and the dielectric layer having a plurality of conductive paths through the dielectric layer for bonding with inter-layer conductors in an upper, transfer device layer.

4B. The method of clause 3B further comprising aligning of the transfer device layer to the semiconductor substrate to permanently bond the inter-layer conducting path.

5B. The method of clause 4B further comprising removing the temporary bonded semiconductor substrate from the transfer device.

6B. The method of clause 5B further comprising forming an internal flow path to allow coolant to traverse there through to cool the transfer device.

7B. The method of clause 1B wherein the plurality of transistor devices are selected from at least one of CMOS devices, bipolar transistors, logic devices, memory devices, digital signal processing devices, analog devices, light absorbing and imaging devices, photo-voltaic cells or micro-electrical mechanical structures (MEMS), or any combination thereof.

8B. The method of clause 1B wherein implantation process ranges from 500 kilovolts to 2 MeV.

9B. The method of clause 1B wherein the cleave region is positioned 1 to 10 microns from a top surface of the dielectric material.

10B. The method of clause 1B wherein the unpatterned photoresist material is selected with high absorptivity of electromagnetic radiation with a wavelength less than 400 nm.

11B. The method of clause 1B wherein the semiconductor substrate comprises a silicon or other suitable material for formation of electrical, optical or electromechanical devices.

12B. The method of clause 1B wherein the implantation process is provided at a dose ranging from 5E16 to 5E17 particles/centimeter2.

13B. The method of clause 1B wherein the implantation process is provided using a beamline implanter.

14B. The method of clause 1B wherein the implantation process is provided by a linear accelerator (LINAC) process.

15B. The method of clause 1B wherein the cleave region having a peak concentration at an edge of an implantation range.

16B. The method of clause 1B wherein the cleave region comprises a plurality of hydrogen gas-filled micro-platelets.

17B. The method of clause 1B wherein the cleave region is characterized by a stress sufficient to induce propagation of an approximately planar cleave region.

18B. The method of clause 1B further comprising forming a plurality of interconnect structures between the backside surface and either the plurality of transistors or the interconnect region.

19B. The method of clause 1B further comprising providing a second semiconductor substrate comprising a plurality of second transistor devices and an overlying second dielectric material; and bonding the second dielectric material configured with the second semiconductor substrate to form a stacked semiconductor structure.

20B. The method of clause 1B further comprising forming a patterned photoresist material overlying the unpatterned photoresist material.

21B. The method of clause 1B wherein the cleave region is configured as a uniform implantation region or a patterned implantation region.

22B. The method of clause 1B wherein the plurality of transistor devices and the inner connect region are characterized by a thickness of three microns and less; wherein the implantation process is characterized by a range of five microns to ten microns such that a characteristic size of the plurality of transistor devices and the interconnect region does not influence the implantation process.

23B. The method of clause 1B wherein the plurality of transistor devices and the inner connect region are characterized by a thickness of three microns and less; wherein the implantation process is characterized by a range of five microns to ten microns such that a characteristic spatial dimension of the range of the implantation is not interfered by the thickness of the plurality of transistor devices and the interconnect region.

24B. The method of clause 1B wherein energy is selected from thermal, mechanical, chemical, electrical, or combinations thereof to provide a cleave inducing energy.

25B. The method of clause 1B wherein the energy is provided to cause a controlled cleaving action including an initiation of cleaving and propagation of cleaving.

26B. The method of clause 1B wherein the energy is provided to form a plurality of micro-platelet bubbles in the cleave region.

27B. The method of clause 1B wherein the plurality of transistor devices is provided for a memory array or a logic array.

28B. The method of clause 1B wherein the cleave region is patterned or graded to facilitate a controlled cleaving action.

29B. A method for fabricating an integrated circuit, the method comprising:
providing a semiconductor substrate comprising a surface region, a plurality of transistor devices formed overlying the surface region, an interlayer interconnect region comprising a structured metal layer and a structured dielectric layer and an inter-layer connection overlying the plurality of transistor devices, and a dielectric material overlying the interconnection region to provide a bonding interface;
forming an absorber material overlying the bonding interface provided from the dielectric material, the absorber material configured to shield one or more of the plurality of transistors from electromagnetic radiation in a wavelength range of below 400 nm and to selectively adjust a depth of a subsequent implanting process;
subjecting the absorber material to the implantation process to introduce a plurality of hydrogen particles through the absorber material to a selected depth to a cleave region underlying the surface region of the semiconductor substrate to define a transfer device between the cleave region and a surface of the dielectric material to form a thickness of a multi-layer of a plurality of interconnected conductive metal layers and insulating dielectric having a total metal thickness of 3 to 5 microns or less;
removing the absorber material after the hydrogen implant step;
bonding the surface of the dielectric material overlying the transfer device to a transfer substrate to temporarily bond the semiconductor substrate to the transfer substrate;
subjecting sufficient energy to a portion of the cleave region to remove an upper portion of the semiconductor substrate from a lower bulk substrate material, while using the transfer substrate to hold the upper portion of the semiconductor substrate such that the upper portion comprises a hydrogen damaged region;
subjecting the hydrogen damaged region overlying the transfer device to a smoothing process to remove a portion or all of the portion or all of the hydrogen damaged region and to form a backside surface; and
forming a thickness of dielectric material overlying the backside surface.

30B. The method of clause 29B wherein the absorber material comprises photoresist.

31B. The method of clause 29B wherein the absorber material comprises oxide.

32B. The method of clause 31B wherein the oxide comprises CVD silicon oxide.

33B. The method of clause 29B wherein the absorber material comprises a patterned layer over an unpatterned layer.

34B. The method of clause 33B wherein a thickness of the unpatterned layer shifts a peak of the proton profile to be at a depth of the desired location of a cleave surface, and a thickness of the patterned layer shifts the peak to a height of a coolant channels to be formed.

35B. The method of clause 29B wherein the absorber material comprises nitride.

Generally, high-performance logic devices generate heat in regions of high switching activity in the logic core. These sources of switching heating are well known design concerns in complex system on a chip (SOC) and central processing unit (CPU) devices. The retention of data in memory devices is generally degraded with increasing temperature, so the integrated stacking of logic and memory layers is challenged by these thermal concerns. Thermal controls become more important as the density and diversity of the 3D device stack increases.

While beneficial for thermal bonding efficiency, use of oxide layers in the bonding stack may be limited as a heat transfer layer by the relatively low thermal conductivity of $SiO_2$. The use of higher thermal conductivity, electrically insulating materials as inter-layer structures can increase the heat transfer from local device thermal source regions.

Accordingly, in certain embodiments it may be desirable to add structured high-thermal conductivity layers between heat generating device layers, in order to facilitate thermal spreading and removal of heat from the device stack. Specifically, using high-energy proton implantation, low-thermal budget layer cleaving and transfer bonding, may facilitate heat spreading from local device structure "hot spots" and efficiently remove device thermal energy through the use of local coolant flows.

Proton cleaving and layer transfer methods, combined with the patterned cleave regions formed by use of a patterned top layer of photo-resist (or oxide as discussed below) at the proton implant step, bonded to a planar device surface to form inter-layer channels for stack coolant flows, and the use of inter-layer structures with high-thermal conductivity (and low electrical conductivity), provide a flexible design elements for controlling the thermal environment in a complex 3D device stack.

Comparing the thermal conductivity of a variety of common semiconductor materials indicates a variety of materials with substantially higher thermal conductivity than $SiO_2$, with SiC and $Al_2O_3$ (sapphire) comprising candidates for this purpose. Other high thermal conductivity materials may also be used for the purpose enhancing heat spreading and transport by factors of ≈10 to ≈100, compared to equivalent $SiO_2$ layers.

The following lists thermal conductivity (in W/m-K) of several common semiconductor and insulator films.
Si: 130 (W/m-K)
$SiO_2$: 1.3 (W/m-K)
SiC: 120 (W/m-K)
Ge: 58 (W/m-K)
GaAs: 52 (W/m-K)
$Al_2O_3$: 30 (W/m-K)

Inter-layer thermal spreading layer thickness of ≈0.5 to 2 um, may be expected for efficient heat flows.

Figure 16:
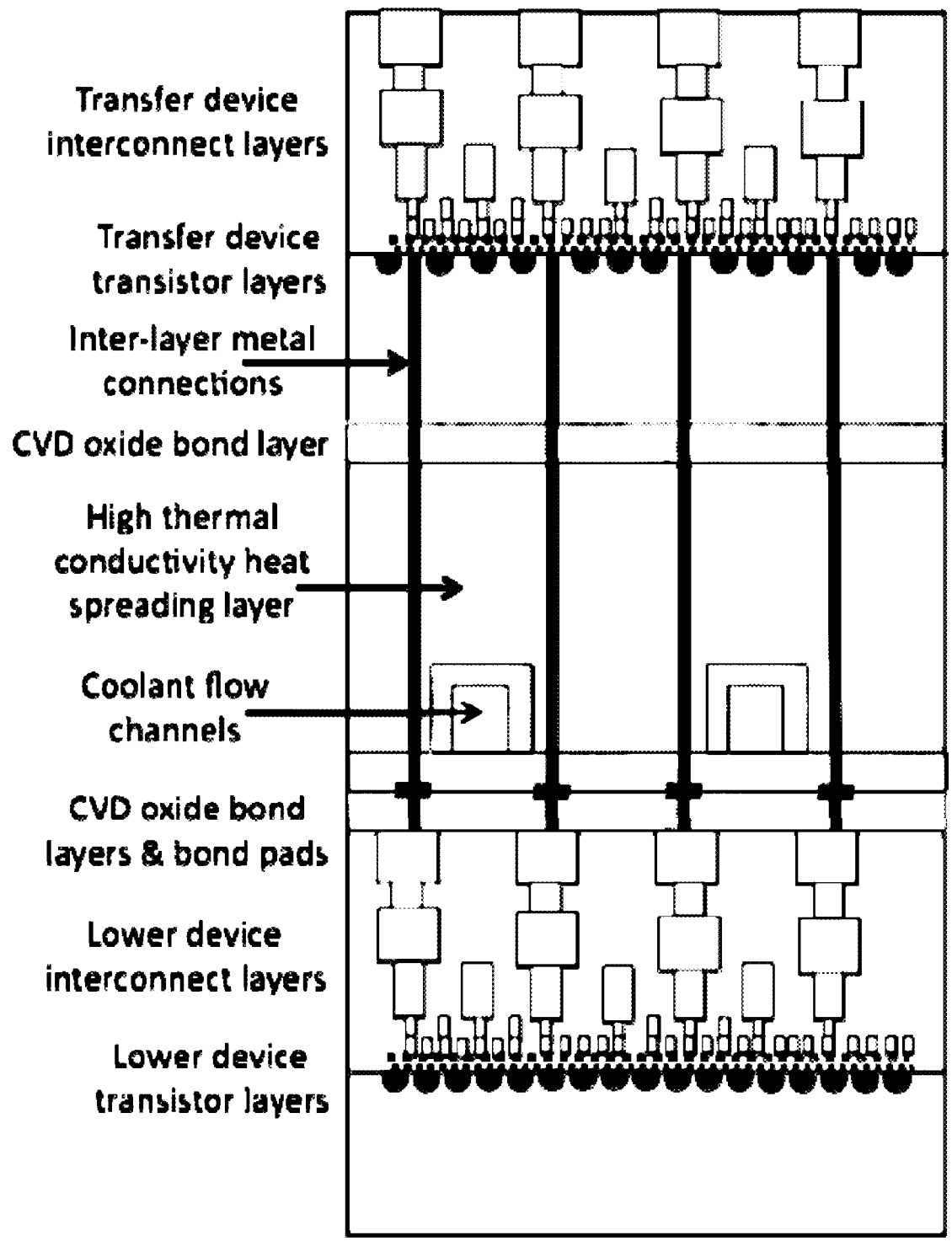
FIG. 16 is a simplified cross-sectional view showing a patterned high-K layer in place, incorporating coolant channels.

FIG. 16 shows a simplified cross-sectional view including a high-K layer in place, incorporating coolant channels.

1C. An apparatus comprising:
  a first integrated circuit including a first metal interconnect layer;
  a second integrated circuit including a second metal interconnect layer; and
  an inter-layer structure including a high-thermal conductivity, low electrical conductivity material and bonded to the first metal interconnect layer by a CVD oxide bond layer.

2C. An apparatus of clause 1C wherein the inter layer structure further comprises inter-layer channels for stack coolant flows.

3C. An apparatus of clause 1C wherein the high-thermal conductivity material exhibits a thermal conductivity greater than 1.3 (W/m-K).

4C. An apparatus of clause 1C wherein the first integrated circuit is formed by proton implant into the first metal interconnect layer followed by cleaving.

Integrated circuit devices, containing diverse layers of semiconductor, dielectric and metal materials, may develop substantial internal stresses during fabrication. Unaddressed, these stresses may be sufficiently high to warp full thickness Si wafers, with thickness greater than 700 micrometers, into a variety of concave, convex, and complex "potato chip" shapes. These deformations may be sufficiently large to create issues in fine-line lithography optics during device fabrication.

If a stress-containing device layer on a detached thin (e.g., several micrometers) substrate were placed in an unsupported fashion on a planar surface, the stress-induced deformation of a wafer-scale combination could pose a challenge for bonding to a planar substrate surface. Because of these effects, thin device layers may be attached to stiff bonding structures, capable of maintaining a planar bond interface with the stressed layer attached, before they are detached from their initial substrate wafers.

Figure 17A:
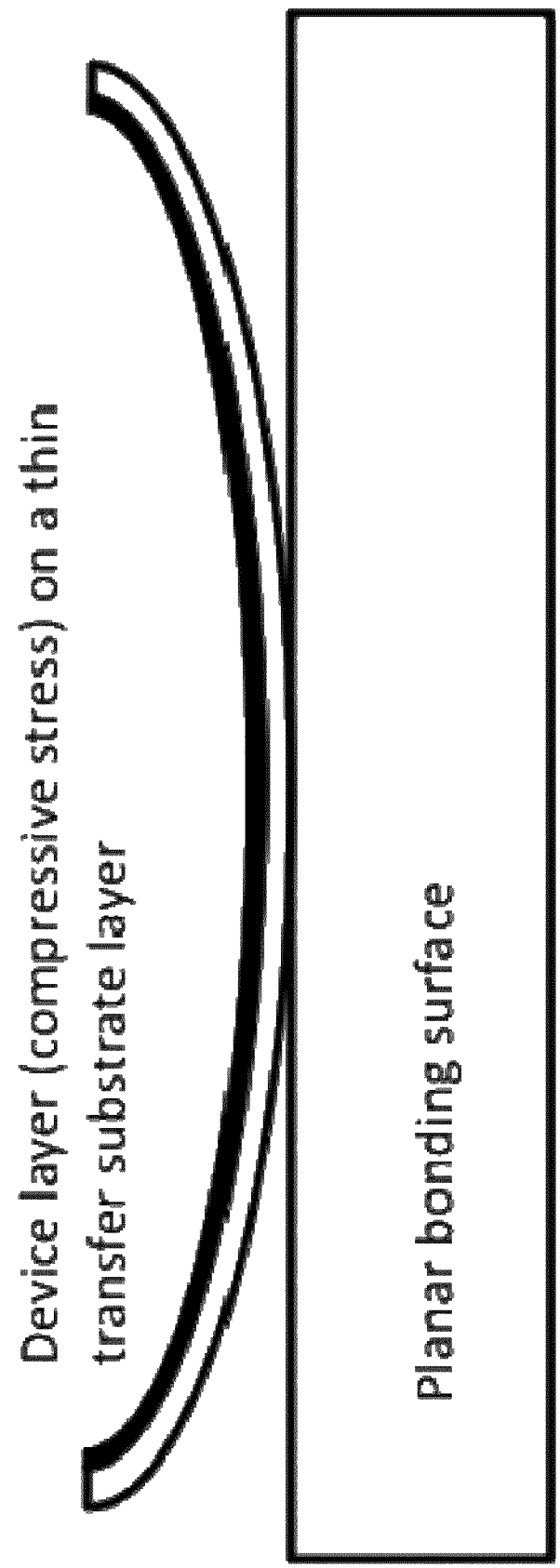
FIG. 17A is a simplified cross-sectional view showing an example of a detached, unsupported, device layer, under net compressive stress after its fabrication, on a thin substrate layer, deforming its thin substrate layer into a concave shape.

FIG. 17A shows a simplified view of an example of a detached, unsupported, device layer, under net compressive stress after its fabrication, on a thin substrate layer, deforming its thin substrate layer into a concave shape. Actual device layer deformations can be in concave, convex, and complex "potato chip" shapes. These deformations can lead to challenges when bonding to a planar surface as well as to bond failures and device degradation due to excess local stresses during subsequent thermal cycles during additional fabrication steps and during device operation.

Even with the use of a stiff temporary bond holder to form a stress-containing layer into a planar form suitable for bonding, un-compensated stresses in a complex bonded stack can lead to bond failures and IC device degradation from thermal stress during subsequent fabrication steps and during device operation.

Accordingly, embodiments may provide for the addition of stress-compensating layer(s) to the back side of stressed device thin transfer layers to facilitate a bonding process, including improved inter-layer device and bond pad alignment, and to compensate for deleterious effects of subsequent fabrication and device operation thermal cycles. U.S. Pat. No. 7,772,088 is hereby incorporated by reference for all purposes.

Figure 17B:
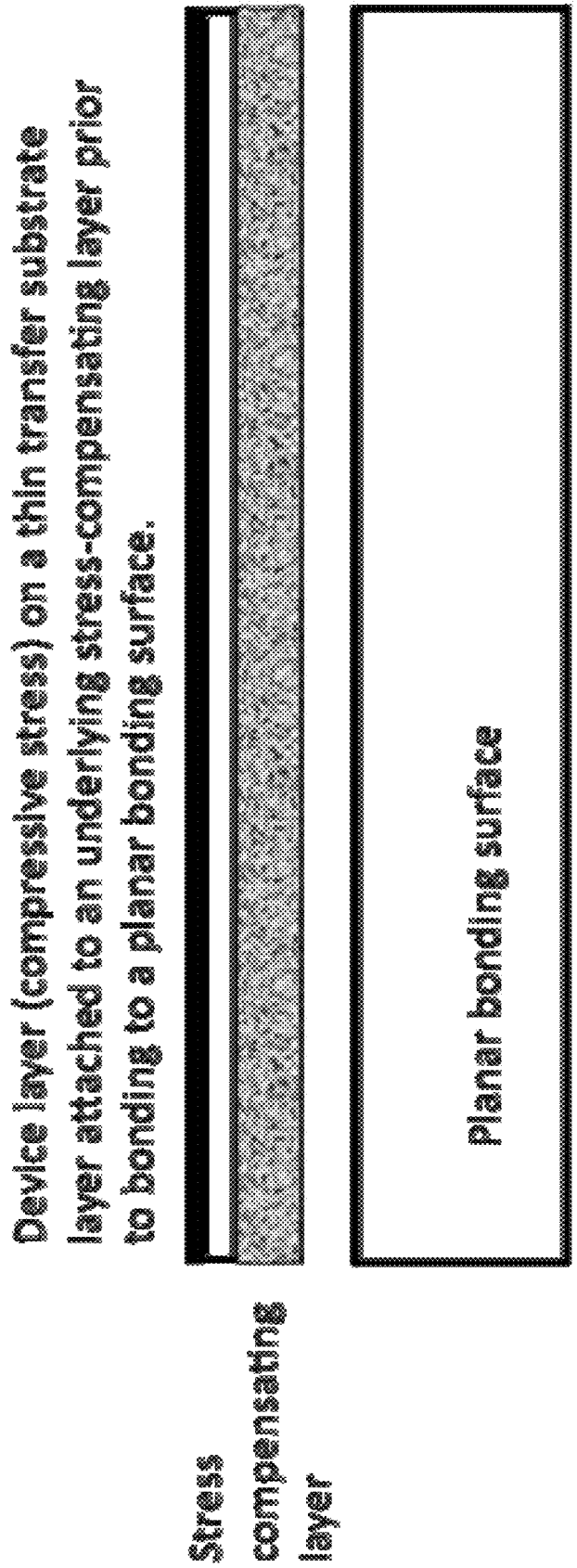
FIG. 17B is a simplified cross-sectional view of the effect of the addition of a stress-compensating layer to the backside of a thin substrate containing a stressed device layer on the top side.

The back side stress compensation materials can be chosen of materials with complementary thermal expansion properties to the device layer and with thickness sufficient to offset the distortion effect of the device structure internal stress FIG. 17B is a simplified cross-sectional view showing the effect of the addition of a stress-compensating layer to the backside of a thin substrate containing a stressed device layer on the top side. The role of the stress-compensating backside layers is to (1) facilitate bonding to a planar bond surface, (2) improve bond pad alignment accuracy during wafer-level bonding, and/or (3) counteract the effects of differential thermal stress during subsequent fabrication steps and during device stack operation.

The stress compensating layers can be formed by direct layer transfer to the transfer device layer backside while the transfer device layer is attached to temporary bonding structure. In some cases, a stress compensating layer can be deposited by CVD or other approaches.

Note that the planar, stress compensated, transfer layer can provide a desirable geometry for achieving a high degree of bond pad alignment during wafer level bonding, one consideration for successful wafer-level bonding for 3DIC manufacturing.

Particular embodiments may employ single crystal layer transfer onto chemical or mechanically "weak" separation layers. In particular, it may be desirable to allow attaching a high-purity, single crystalline material layer onto a temporary holding layer that is sufficiently robust to survive the thermal, chemical and mechanical stresses of IC or other device fabrication processes, but is "weak" enough to form a separation path under directed chemical or mechanical action.

Examples of these weak temporary separation layers can include but are not limited to (1) oxide layers formed by thermal growth, CVD deposition or by direct implantation and subsequent thermal processing, that can form a separation path under an overlying layer by chemical action of a selective etchant, such as HF attack on an underlying SiO2 layer, and (2) various forms of poly-crystalline or porous forms of the general substrate material that are susceptible to form a separation path under selected chemical or mechanical attack. Forms of directed mechanical attack can include but are not limited to, (1) stress-assisted crack formation initiated by a laterally directed force on a separating wedge-shaped tool, and (2) kinetic attack by laterally directed fluid jets into a mechanically weak layer, such as a porous substrate material region.

Some forms of chemically or mechanically weak separation layers may lack the high-level crystalline interface required for epitaxial growth of high-purity and high-quality crystalline upper layers useful for fabrication of high performance semiconductor devices.

Employing high-energy proton implants to form Hydrogen-rich layers for mechanical, room-temperature separation along well-defined cleave surfaces, embodiments can be used to separate and bond entire device structures, including a fully-formed transistor layers and multi-level metal interconnect networks onto suitably chosen temporary separation layers for later fabrication and device integration processing. This may be followed by subsequent separation from the carrier substrate.

The methods and apparatuses according to embodiments can also be used to separate and bond uniform, high-purity and crystalline layers to be formed into electrical, mechanical or optical devices followed by subsequent separation from the carrier substrate.

Figure 18:
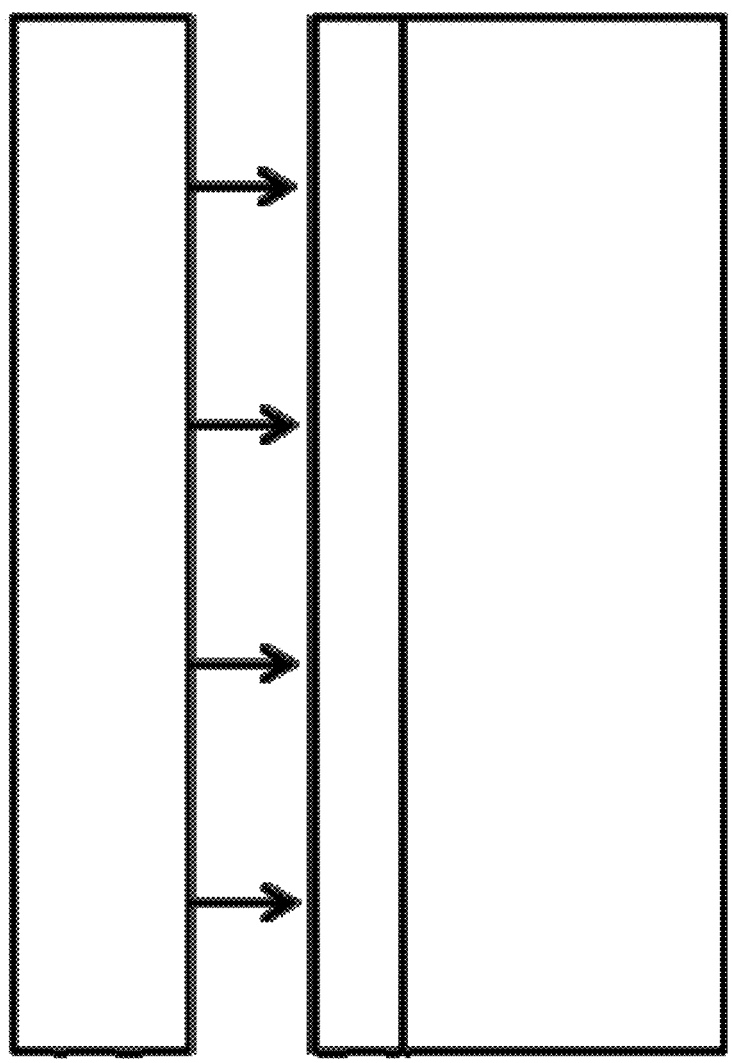
FIG. 18 is a simplified view of the bonding a high-purity, single crystalline transfer layer onto a chemically or mechanically "weak" separation layer on a substrate.

FIG. 18 is a simplified view of the bonding a high-purity, single crystalline transfer layer onto a chemically or mechanically "weak" separation layer on a substrate. The upper crystalline transfer layer is formed to the desired thickness by the use of high-energy proton implantation and room-temperature separation along the peak of the proton distribution. The upper transfer layer can be a uniform crystalline layer or including a combination of IC, mechanical or optical devices and their corresponding metal interconnect networks.

Embodiments may also provide proton implants useful for separation and layer transfer stacking of highly-sensitive CMOS device structures. As previously mentioned, embodiments utilize high-energy proton implants to form a Hydrogen-rich cleave surface several microns below the combined thickness and stopping power effects of a combination of top layers of photo-resist or CVD dielectrics, and a multi-layer metal interconnect network and transistor layers.

Radiation damage effects arising from the passage of a high-dose, high-energy proton beam through the metal interconnect and transistor layers, may be at manageable levels— recoverable by standard annealing cycles at modest temperatures. Moreover, where specific radiation damage effects are of particular concern, embodiments can include an implementation that bypasses concerns for radiation damage effects in device dielectric layers.

One issue relating to possible radiation damage during high-dose, high-energy proton implants into CMOS device layers and their associated metal interconnect network layers, is bond-breaking effects in various dielectric layers. This can be due to electronic stopping events from the passage of the energetic proton beam or from uv-radiation from ion-electron relaxation following recombination event in the accelerator beam line.

When the high-dose, high-energy proton implantation is performed at specific points during the CMOS device fabrication process, radiation effects from the proton beam can be substantially avoided. One point in the CMOS process can be identified as occurring after the high temperature (e.g., greater than 500° C.) processes associated with activation of dopants in CMOS junctions are completed, and before the deposition of sensitive gate stack oxides and subsequent incorporation of inter-layer dielectrics in the metal interconnect network.

At such a point in the CMOS fabrication process, the principal material in the device wafer is crystalline silicon in doped junctions, with poly-silicon filled lateral isolation regions, and the substrate wafer. The only substantial, long-term radiation damage effects in predominantly silicon material are associated with lattice damage arising from the nuclear stopping components of the proton slowing down process.

Lattice damage events for a high-energy proton beam may be localized near the peak of the proton profile. According to embodiments, that peak may be placed several microns below the CMOS junctions in the transistor layer and provide key hydrogen-trapping sites for localization of the cleave surface during layer separation. The several micron separation between the CMOS transistor layer and its associated carrier depletion layers and the proton-induced lattice damage in the region of the subsequent layer separation, may be sufficient to avoid risk for deleterious device effects from the proton lattice damage layer.

In many advanced CMOS devices, the gate stack regions are initially defined by temporary films and structures which are "replaced", after completion of the high-temperature thermal cycles, by final device structures incorporating high-dielectric constant ("high-k") gate oxides and multi-layer metal gate electrodes. Following the "replacement gate" fabrication cycles, the material properties of the final gate and inter-metal layer ("low-k") dielectrics limit allowable thermal cycles for the final CMOS device fabrication process to be less than 500° C.

A high-dose proton implant performed at the point just before the "replacement gate" fabrication, would avoid risk of damage to the final device gate and inter-metal layer dielectrics and would not be exposed to 500° C. or higher thermal cycles, that could lead to spontaneous layer separation prior to the desired non-thermal separation process at layer separation after the fabrication of the transfer device layers is completed.

Figure 19A:
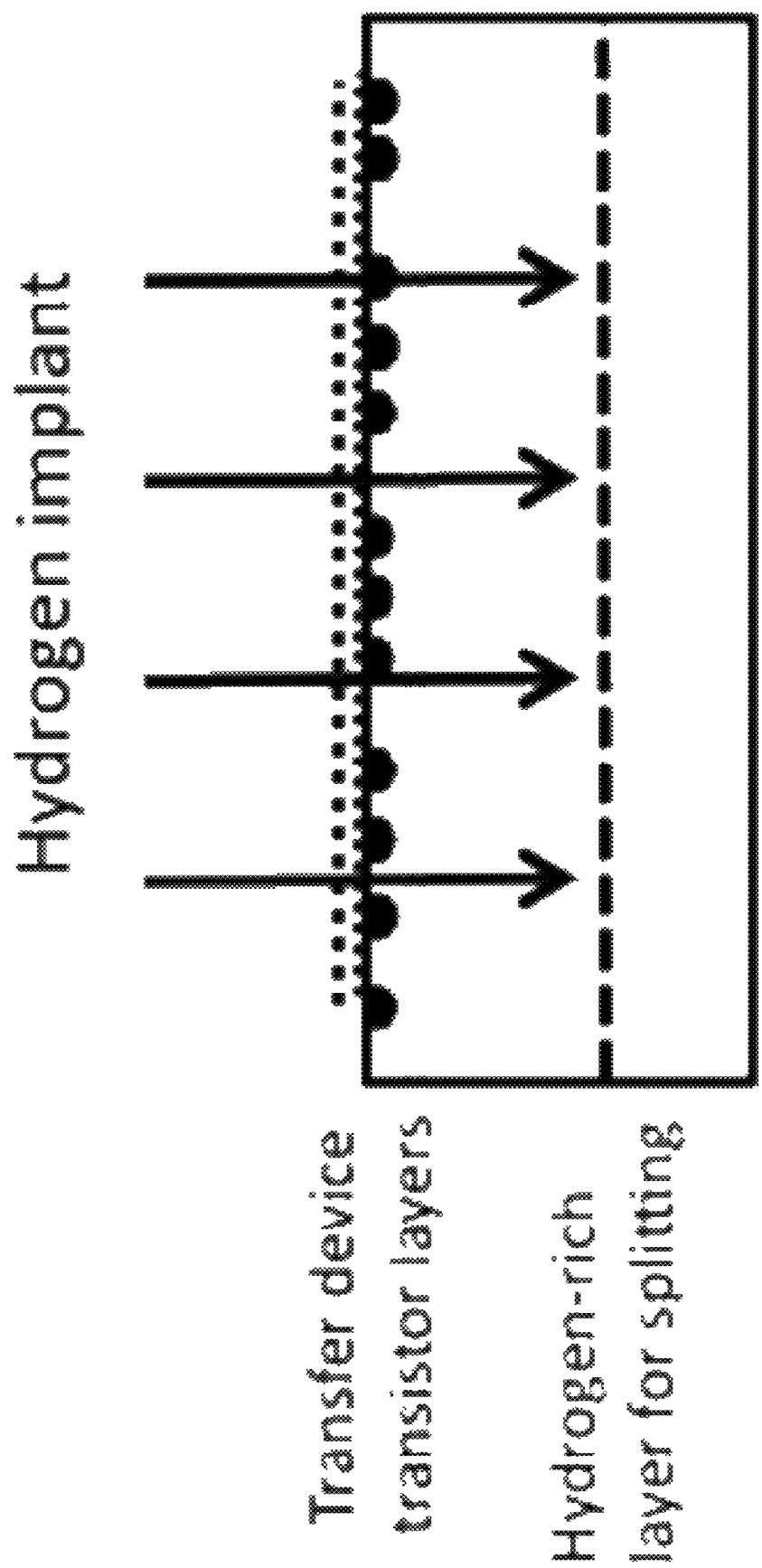
FIG. 19A shows a simplified cross-sectional view of high-energy, high dose proton implant to form a Hydrogen-rich layer placed several microns below the CMOS transistor layer.

FIG. 19A shows a simplified cross-sectional view of high-energy, high dose proton implant to form a Hydrogen-rich layer placed several microns below the CMOS transistor layer. This is performed after completion of >500° C. anneals associated with dopant activation in the transistor junctions and before fabrication of "replacement gates" including final device gate dielectrics and metal gate electrodes.

Figure 19B:
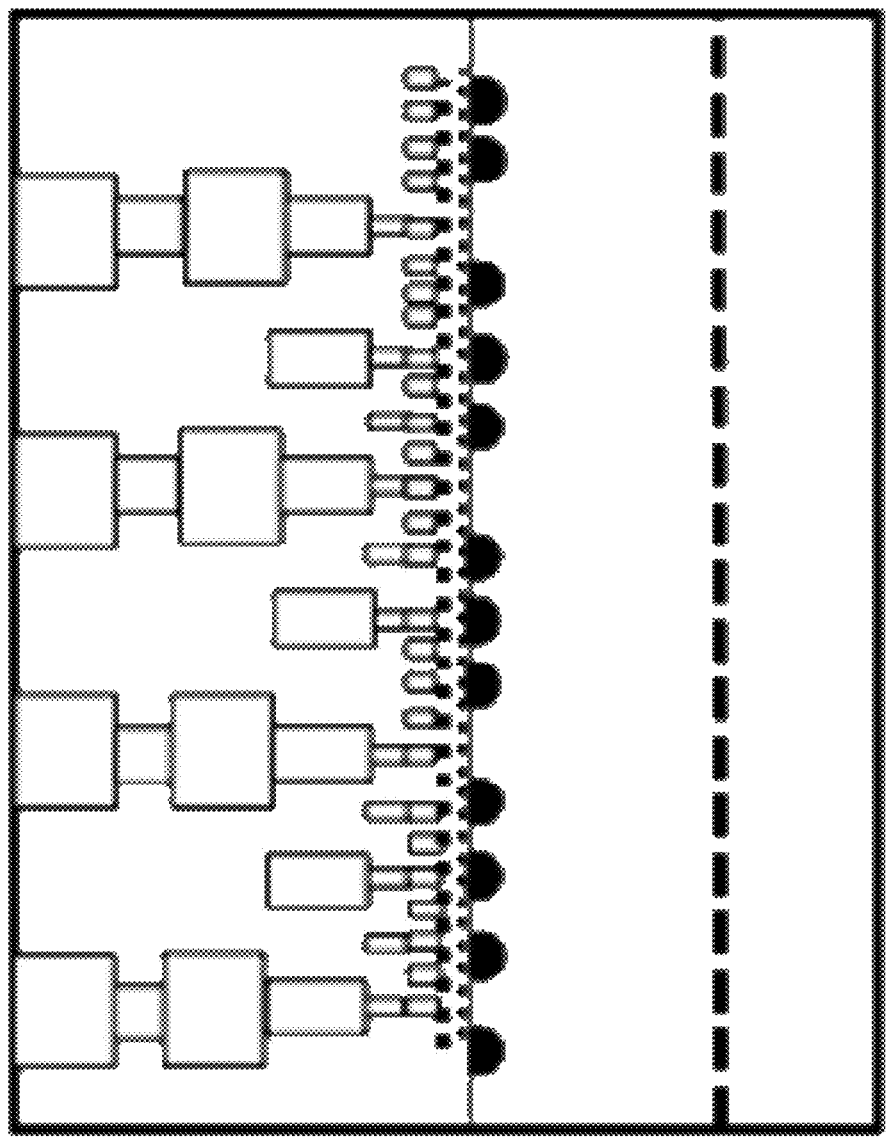
FIG. 19B is a simplified cross-sectional view of CMOS device layers after completion of the formation of final gate stack and metal interconnect structures, with a Hydrogen-rich layer formed by a high-energy, high-dose proton implant performed just prior to the "replacement gate" fabrication steps.

FIG. 19B is a simplified cross-sectional view of CMOS device layers after completion of the formation of final gate stack and metal interconnect structures, with a Hydrogen-rich layer formed by a high-energy, high-dose proton implant performed just prior to the "replacement gate" fabrication steps. The materials properties of the final gate and inter-metal layer dielectrics limit the fabrication process temperatures to be below 500° C., which also avoids conditions leading to spontaneous splitting along the Hydrogen-rich region prior to the desired separation, by non-thermal approaches, after completion of the full device structure.

Utilization of methods and apparatuses according to embodiments may permit modulation of inter-layer bandwidth by stacking order and inter-layer thickness. Specifically, a principal goal of 3DIC stacking is to provide an alternative path for increasing the bandwidth for signal processing communications between devices.

Bandwidth is the product of the data signal frequency, often approximated by the CPU clock frequency, and the number of external communication channels. For much of its history, IC development has focused on increasing the CPU and other data processing chip cycle frequencies, possibly at the cost of increasing chip power use. The number of communication channels has been limited by the density of bond pads available along the periphery of a planar device.

The development of 3DIC stacking methods has increased the possible number of vertical channels, measured by the density inter-layer communication lines. This density of inter-layer communication channels increases as vertical connection channel density increases. A convenient measure of the density of inter-layer connections is the inverse square of the communication pin separation or "pitch". Specifically, IO density=$1/(\text{pin pitch})^2$.

The minimum metal channel or "pin" pitch, depends on a variety of process and device considerations. One factor is the aspect ratio (AR) of the inter-layer metal channels: the ratio of the metal line diameter to the length of the via hole to be filled. Conventional "Through Silicon Via" (TSV) structures may typically exhibit an AR of between about 5 to 20. This is significantly higher than the typical design rules for vias in high-density metallization for IC devices—often with an AR of less than 2.

One device consideration affecting the packing density of conventional TSV structures, is the inter-device stress arising from the different thermal expansion of micrometer-scale Cu cylinders and Si device materials. The undesirable local stress in the immediate surroundings of a Cu via line can lead to design rules defining micrometer-scale "keep out" zones, where active circuit element are excluded from the vicinity of Cu via landing pads. This affects circuit density, performance, and yield.

Accordingly, methods and apparatus of specific embodiments may provide one or more procedures to locally increase the inter-level metal channel density and corresponding communication bandwidth between adjacent device layers. Use of high-energy, high-dose proton implants through a substantially completed metal interconnect network and fully formed CMOS transistor layer for formation of a Hydrogen-rich region for non-thermal layer separation and bonding onto a 3DIC stack, provides an inter-layer separation of a few micrometers (or less, for the cases of device layers on SOI buried oxides or other device types with minimal carrier depletion layer thicknesses). This allows substantially less inter-layer separation than the tens of micrometers typical of present day TSV and interposer stacking methods. The thinner inter-device Si layers and elimination interposer and associated adhesive layers provide by embodiments allows for fabrication shorter and thinner inter-device metal signal connections and greatly reduces the "dead zone" effects arising from thermal stress of present day several microns thick Cu TSV channels.

Where high inter-layer bandwidth is desired (e.g., connections from CMOS image sensor layers and signal processing devices), some embodiments may employ a variety of layer transfer techniques to align and bond the top layer of the metal interconnect network of the transfer device to inter-layer connection channels in the top layer of the metal network of the lower device layer in the 3DIC stack. Such layer transfer approaches are outlined in FIGS. 12 through 15.

With this particular procedure, the inter-layer communication channel density can be expected to be similar to the pin density in the top layer metallization layers in the two device layers, with pin pitch on the order of a few micrometers or less. This "top-to-top" layer bonding results in a factor of 100 to 1,000× higher inter-layer connection density, and corresponding increased bandwidth, than existing 2.5D and 3D chip stacking technologies.

Figure 20:
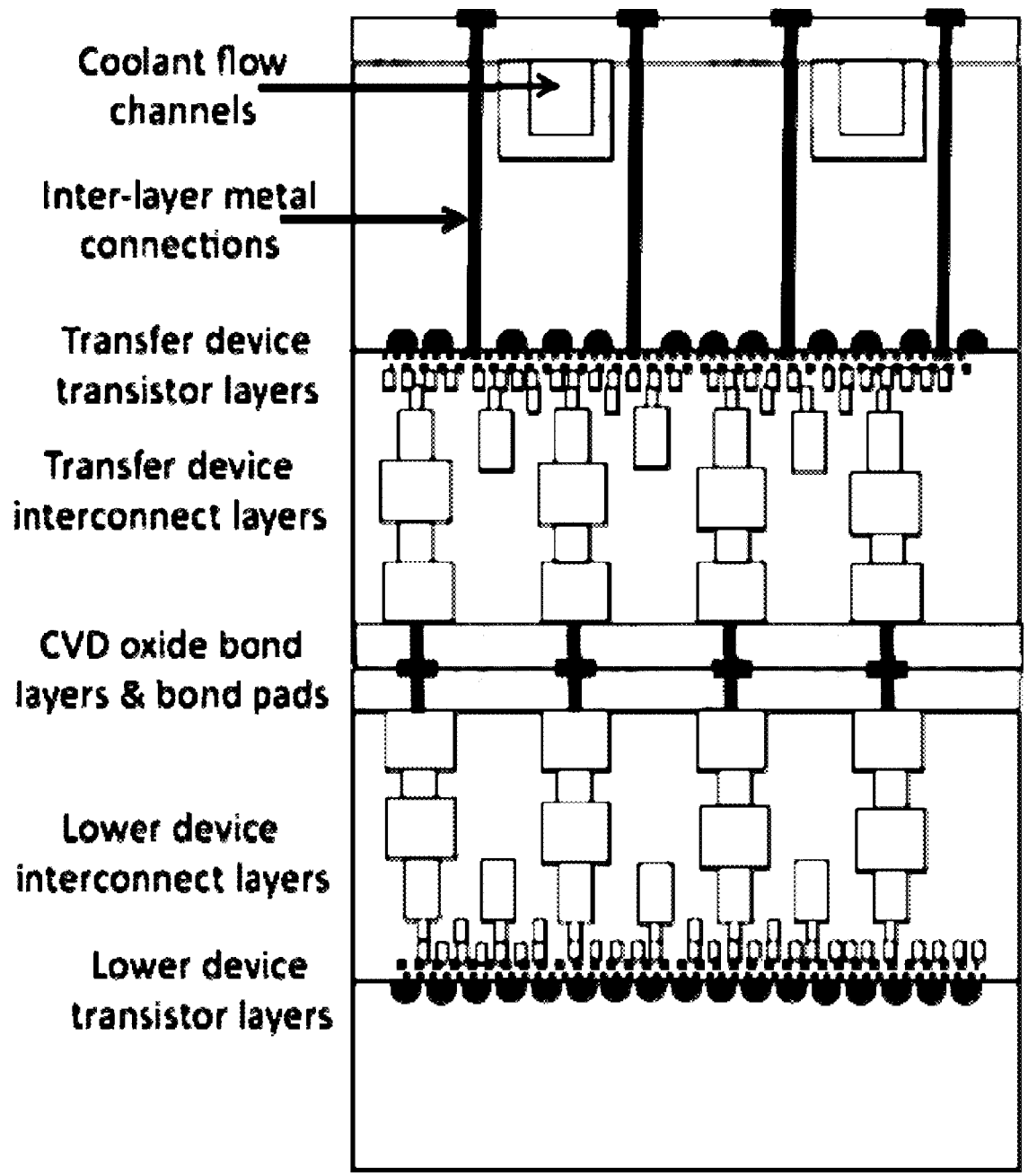
FIG. 20 shows a simplified cross-sectional view of a "top-to-top" metal layer bonding of a transfer device layer and a lower device layer in a 3DIC stack.

FIG. 20 shows a simplified cross-sectional view of a "top-to-top" metal layer bonding of a transfer device layer and a lower device layer in a 3DIC stack. This approach can provide inter-level metal connection channel densities, and corresponding increased bandwidth, similar to via densities of the top metal layers of CMOS devices.

Specific examples of 3DIC structures according to embodiments may be characterized by an IO density (in Pins/cm2) of between about 1.0E+06-1.0E+08, over a pin pitch range (in nm) of 1.E+02-1.E+04. In an example, for a TSV depth of 1 μm, aspect ratios (depth:minimum width of diameter) may range from between 10 to 1 over a range of TSV diameters from about 0.1 to 1 μm.

As mentioned above, proton implantation to form a 3DIC structure according to embodiments, may take place at energies of about 1 MeV, including energies of between about 300 keV-5 MeV, about 500 keV-3 MeV, about 700 keV-2 MeV, or about 800 keV-1 MeV. Incorporated by reference herein for all purposes, is U.S. Patent Publ. No. 2008/0206962.

It is noted that implant properties of hydrogen ions at such higher energy ranges may vary as between the 40 keV energies typical of layer transfer processes for SOI wafer manufacturing. A first order description is the ratio of the "half-width" of the proton profile reflecting "straggling" (<ΔX>), to the depth of the "projected range" profile (<X>).

Comparison of such <ΔX>/<X> results in an example, is as follows:

proton implant energy 40 keV: <ΔX>/<X>=0.196≈0.2
proton implant energy 1 MeV: <ΔX>/<X>=0.048≈0.05

Thus, the 1 MeV proton profile is ≈4× "sharper" than the 40 keV profile.

While the above is a full description of the specific embodiments, various modifications, alternative constructions and equivalents may be used. Therefore, the above description and illustrations should not be taken as limiting the scope of the present invention which is defined by the appended claims.

The invention claimed is:

1. A method comprising:
providing a first substrate having dielectric structures and conductive structures;
forming an absorber material over the dielectric structures and conductive structures;
implanting ions into the first substrate, the ions traveling through the dielectric structures and the conductive structures and the absorber material to define a cleave plane in the first substrate;
removing the absorber material; and
cleaving the first substrate at the cleave plane to obtain a cleaved layer having the dielectric structure and the conductive structures,
wherein the cleaved layer is used to form a three-dimensional integrated circuit device having a plurality of stacked integrated circuit (IC) layers, the cleaved layer being one of the stacked IC layers.

2. A method as in claim 1, wherein the implantation is performed while keeping the first substrate at a temperature of 500 degrees Celsius or less.

3. A method as in claim 1, wherein the implantation energy is greater than 100 KeV and the ions are protons.

4. A method as in claim 3, wherein the implantation energy is 300 KeV or greater.

5. A method as in claim 3, wherein the implantation energy is 500 KeV or greater.

6. A method as in claim 3, wherein the implantation energy is 1 MeV or greater.

7. A method as in claim 1, wherein the dielectric structures and the conductive structures are formed on the first substrate by performing a plurality of processing steps on the first substrate.

8. A method as in claim 1 further comprising bonding the substrate to a holder prior to the cleaving.

9. A method as in claim 8 wherein the substrate is temporarily bonded to the holder.

10. A method as in claim 9 wherein the holder comprises a stress compensating layer.

11. A method as in claim 1 wherein one of the plurality of stacked integrated circuit (IC) layers comprises a high thermal conductivity material.

12. A method as in claim 1 further comprising bonding the cleave plane to an interconnect of another of the stacked IC layers of the three-dimensional integrated circuit device.

13. A method as in claim 1 further comprising bonding an interconnect of the cleaved layer to an interconnect of another of the stacked IC layers of the three-dimensional integrated circuit device.

14. The method of claim 1, wherein the absorber layer includes a patterned layer.

15. The method of claim 14, wherein the patterned layer defines a coolant channel in the cleave plane.

16. The method of claim 14, wherein the absorber layer controls a depth of a peak of a damage profile of the cleave plane.

17. The method of claim 14, wherein the absorber layer defines a cleave plane that varies in three dimensions according to a shape of the absorber layer.

18. The method of claim 1, wherein the absorber layer includes a patterned photoresist layer formed over an unpatterned photoresist layer.

19. The method of claim 1, wherein the absorber material comprises an oxide.

20. The method of claim 1, wherein the absorber material includes at least one of an oxide layer and a nitride layer, and the absorber material is deposited by a chemical vapor deposition (CVD) process.

21. The method of claim 1, wherein a material and a thickness of the absorber layer is chosen to define a shape of the cleave plane.

22. The method of claim 1, wherein a material and a thickness of the absorber layer is chosen to absorb UV radiation from a proton accelerator beam line.

* * * * *